United States Patent
Park

(10) Patent No.: US 9,218,011 B2
(45) Date of Patent: Dec. 22, 2015

(54) CORNER-CASE EMULATION TOOL FOR THERMAL POWER TESTING

(71) Applicant: QUALCOMM Incorporated, San Diego, CA (US)

(72) Inventor: Hee-Jun Park, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 192 days.

(21) Appl. No.: 14/011,915

(22) Filed: Aug. 28, 2013

(65) Prior Publication Data

US 2015/0061754 A1    Mar. 5, 2015

(51) Int. Cl.
*G06F 17/50* (2006.01)
*G05F 1/46* (2006.01)
*G01R 31/317* (2006.01)

(52) U.S. Cl.
CPC .......... *G05F 1/463* (2013.01); *G01R 31/31721* (2013.01); *G01R 31/31724* (2013.01); *G05F 1/462* (2013.01)

(58) Field of Classification Search
CPC ..... G06F 17/5068; G06F 1/26; G06F 1/3203; H03K 17/16; G01R 31/025; G01R 31/02; G01R 31/3624
USPC .......................................... 716/109, 115, 133
See application file for complete search history.

(56) References Cited

U.S. PATENT DOCUMENTS 5,600,578 A * 2/1997 Fang et al. ...................... 703/14
7,188,325 B1 * 3/2007 Evers et al. ......... G06F 17/5045
716/113

7,412,353 B2    8/2008  Borkar et al.
8,310,370 B1   11/2012  Williams, Jr. et al.
2008/0046228 A1  2/2008  Cha et al.
2010/0327892 A1 12/2010  Agarwal et al.

(Continued)

FOREIGN PATENT DOCUMENTS

EP      1640886 A1     3/2006
JP    2005031860 A     2/2005

OTHER PUBLICATIONS

Sharifi S., et al., "Accurate Direct and Indirect On-Chip Temperature Sensing for Efficient Dynamic Thermal Management" IEEE Transactions on Computer-Aided Design of Integrated Circuits and Systems, vol. 29 (10), Oct. 2010, pp. 1586-1599.
Xue B., et al., "Voltage Sensing Based Built-in Current Sensor for IDDQ Test," Dec. 2005, 162 Pages.

(Continued)

*Primary Examiner* — Nghia Doan
(74) *Attorney, Agent, or Firm* — The Marbury Law Group, PLLC

(57) ABSTRACT

The various aspects provide for an IC design and methods for utilizing the IC design to emulate corner case ICs during power/thermal testing of a test system by installing a specially chosen IC on the test system. The chosen IC may be a fully functioning IC that also includes a leakage-add controller and a current leak circuit. The current leak circuit may simulate additional current leakage on the IC and may be driven by the leakage-add controller. The chosen IC may also include a programmable voltage table for adjusting the chosen IC's operational voltage. The chosen IC may emulate the thermal characteristics of various corner-case ICs while performing normal IC activities on the test system during power/thermal testing, thereby eliminating current limitations in thermal/power testing of test systems due to the difficulty of providing corner-case ICs and testing those corner-case ICs on various test systems.

22 Claims, 17 Drawing Sheets

(56) References Cited

U.S. PATENT DOCUMENTS

2011/0181308 A1 7/2011 Ishida et al.
2012/0119918 A1* 5/2012 Williams ................ 340/664

OTHER PUBLICATIONS

International Search Report and Written Opinion—PCT/US2014/052196—ISA/EPO—Jan. 16, 2015.

* cited by examiner

| Frequency (MHz) | Required Voltage (mV) | | | | |
| --- | --- | --- | --- | --- | --- |
| | Bin 1 | Bin 2 | Bin 3 | Bin 4 | Bin 5 |
| 700 | 950.0 | 925.0 | 900.0 | 900.0 | 875.0 |
| 900 | 975.0 | 950.0 | 925.0 | 912.5 | 900.0 |
| 1200 | 1037.5 | 1012.5 | 987.5 | 975.0 | 962.5 |

FIG. 1A

| Bin # | No. of Devices/Bin | Leakage (mA at 1.05V) | | | | | |
|---|---|---|---|---|---|---|---|
| | | Min. | 1% | 25% | Mean | 75% | 99% | Max |
| 5 | 210,000 | 23 | 30 | 38 | 42.7 | 46 | 65 | 103 |
| 4 | 570,000 | 26 | 35 | 45 | 50.4 | 55 | 76 | 104 |
| 3 | 200,000 | 34 | 44 | 55 | 61.7 | 67 | 92 | 104 |
| 2 | 40,000 | 42 | 54 | 67 | 75.4 | 83 | 100 | 104 |
| 1 | 1,000 | 62 | 66 | 83 | 88.7 | 96 | 102 | 104 |

FIG. 1B $$I_{leakage} = IDDQ_{actual} \cdot \left[ e^{m \cdot (V - V_{ref}) + n \cdot (T - T_{ref})} \right] + IDDQ_{additional} \cdot \left[ e^{m \cdot (V - V_{ref}) + n \cdot (T - T_{ref})} \right]$$

FIG. 5B

CORNER-CASE EMULATION TOOL FOR THERMAL POWER TESTING

BACKGROUND

Manufacturers of computing devices that use systems-on-chips, microchips, or other integrated circuits (herein collectively referred to as "ICs") perform thermal/power testing of their devices to confirm that their products comply with thermal limits and design power and battery life specifications for all ICs received from IC manufactures. The thermal/power characteristics of a device utilizing a particular IC depend on, among other things, the current leakage of the IC and the voltage required for the IC to achieve a particular operational speed (e.g., a first IC may require 950 millivolts and a second IC may require 875 millivolts to achieve the same operational frequency of 384 MHz).

Currently, device manufacturers and IC manufacturers must contend with a lack of uniformity in the performance of the ICs within a given batch (e.g., ICs made in the same production run). In a large production run, each IC has slightly different physical characteristics due to intrinsic, natural variations in the IC's component materials, which introduce variability in the performance of the ICs in the batch and the devices that use those ICs. For example, some ICs may have higher current leakage and/or higher voltage requirements than other ICs in the same batch. Therefore, the process of performing thermal/power testing of devices implementing ICs involves substantial time and effort because the tests must account for the natural variation in the production of ICs in a production batch.

To accomplish thermal/power testing, device manufactures install into their devices ICs provided to them by IC manufactures that represent the best and worst cases of leakage current, processing speed, and thermal performance. These best and worst cases are referred to as "corner cases," and ICs that exhibit these best and worst cases are referred to as "corner-case ICs." Thus, to gain an accurate sense of the performance quality of devices that are installed with different ICs in a batch, manufacturers and other testing facilities must perform various tests on multiple computing devices implementing the corner-case ICs to determine the outer bound performances of their products. To support device manufacturers, IC manufacturers must select the corner-case ICs from their production runs and provide those several ICs to each computing device manufacturer. Thus, IC manufacturers must spend an extensive amount of time identifying ICs for each corner case to be tested by each of their customers. Further, selecting corner-case ICs may be particularly difficult because there may be only a very small number of ICs with performance characteristics close to a desired corner case.

In addition to the time and expense of identifying corner-case ICs, current processes for testing devices that include corner-case ICs may result in physical damage that hinders further (e.g., confirmatory) testing of those devices. In a typical example, computing device manufacturers must solder the corner-case ICs into their test products. After testing, the corner-case ICs are sent back to the IC manufacturer for further testing while still soldered to the test computing devices. At the IC manufacturer, additional testing may be difficult because the corner-case ICs must be unsoldered and re-soldered to other test systems, which may physically damage the corner-case ICs, thereby leading to incomplete or incorrect test results.

SUMMARY

The various aspects provide for an IC design and methods for utilizing the IC design to emulate corner case ICs during power/thermal testing of a test system by installing a specially chosen IC on the test system. In various aspects, this specially chosen IC may be a fully functioning IC that also includes a leakage-add controller and one or more current leak circuits. The one or more current leak circuits may simulate additional current leakage on the IC and may be driven by the leakage-add controller. The chosen IC may also include a programmable voltage table for adjusting the chosen IC's operational voltage. The various aspects therefore provide for using a single IC to emulate the thermal characteristics of various corner-case ICs while performing normal IC activities on the test system during power/thermal testing.

In further aspects, ICs installed in a group of production systems (i.e., devices not used for testing) may be configured to use a leakage-add controller, programmable voltage table, and one or more current leak circuits to adjust their thermal and operating frequency performance to reduce the variability among production ICs. In other words, the one or more of the production ICs may be configured to operate normally at pre-determined target leakage and voltage values when their measured current leakage, thermal performance and/or processing speed are significantly better than the batch average. Thus, by using the aspect current leak circuits, ICs with abnormally better current/thermal performance can be adjusted so their power characteristics are closer to the average.

The various aspects include an integrated circuit that may include a current leak circuit that includes a resistor and a switch configured to couple the resistor to a voltage source, and a leakage-add controller coupled to the current leak circuit and configured to instruct the current leak circuit to control the switch in order to increase leakage current of the integrated circuit by an additional amount of current leakage to match a target leakage value. In an aspect, the integrated circuit may be configured to perform operations of a typical integrated circuit. In another aspect, the integrated circuit may also include a processing unit separate from the leakage-add controller and configured to calculate the additional amount of current leakage. In another aspect, the leakage-add controller may be further configured to calculate the additional amount of current leakage.

In an aspect, the integrated circuit may also include sensors coupled to the leakage-add controller and configured to measure voltage and temperature values of the integrated circuit, wherein the leakage-add controller may scale the additional amount of current leakage based on the voltage and temperature values. In another aspect, the integrated circuit may include a programmable voltage table configured to apply a target voltage value on the integrated circuit. In a further aspect, the target voltage value and the target leakage value may be received from a programming device. In another aspect, the target voltage value and the target leakage value may be derived from a preferred distribution curve of a group of production systems during normal operations.

Further aspects include a method of emulating corner-case integrated circuits in addition to performing normal activities with an integrated circuit that includes a leakage-add controller and a current leak circuit by receiving a corner-case parameter that represents a particular corner-case integrated circuit and implementing the corner-case parameter using the leakage-add controller and the current leak circuit to emulate the particular corner-case integrated circuit. In another aspect, receiving a corner-case parameter may include receiving a target leakage value and receiving a target voltage value. In another aspect, the method may include enabling the leakage-add controller and the current leak circuit in response to receiving the target leakage value.

In an aspect, implementing the corner-case parameter may include implementing the target leakage value and implementing the target voltage value. In a further aspect, the integrated circuit may also include a programmable voltage table and implementing the target voltage value may include implementing the target voltage value with the programmable voltage table.

In another aspect, implementing the target leakage value may include determining an actual leakage value, calculating an additional leakage value required to match the target leakage value such that the additional leakage value may be equal to a difference between the target leakage value and the actual leakage value, determining voltage and temperature sensing values for the integrated circuit, scaling the additional leakage value based on the determined voltage and temperature sensing values, and sending a signal to the current leak circuit to implement the scaled additional leakage value. In a further aspect, implementing the target leakage value may include implementing the target leakage value with at least one of the leakage-add controller and a processing unit. In yet another aspect, the method may include applying with the current leak circuit an amount of current to ground equal to the scaled additional leakage value to ground.

Further aspects include an integrated circuit that may include means for receiving a corner-case parameter that represents a particular corner-case integrated circuit and means for implementing the corner-case parameter to emulate the particular corner-case integrated circuit. In an aspect, the means for receiving a corner-case parameter may include means for receiving a target leakage value and means for receiving a target voltage value. In another aspect, the integrated circuit may also include means for enabling the means for implementing the corner-case parameter in response to receiving the target leakage value. In yet another aspect, means for implementing the corner-case parameter may include means for implementing the target leakage value and means for implementing the target voltage value.

In an aspect, means for implementing the target leakage value may include means for determining an actual leakage value, means for calculating an additional leakage value required to match the target leakage value such that the additional leakage value may be equal to a difference between the target leakage value and the actual leakage value, means for determining voltage and temperature sensing values for the integrated circuit, means for scaling the additional leakage value based on the determined voltage and temperature sensing values, and means for implementing the scaled additional leakage value. In another aspect, means for implementing the scaled additional leakage value may include means for applying an amount of current to ground equal to the scaled additional leakage value to ground.

Further aspects include a method of facilitating corner-case testing of integrated circuits with a programming device by receiving information regarding a batch of integrated circuits, determining corner-case parameters based on the batch information, selecting an integrated circuit in the batch of integrated circuits exhibiting optimal operational speed and leakage characteristics relative to other integrated circuits in the batch of integrated circuits, and using the selected integrated circuit in conjunction with a leakage-add controller and a current leak circuit to emulate each corner-case parameter. In another aspect, using the selected integrated circuit in conjunction with a leakage-add controller and a current leak circuit to emulate each corner-case may include determining a target leakage value for each corner-case, determining a target voltage value for each corner-case, operating the selected integrated circuit at the determined target voltage value for each corner-case, and controlling the leakage-add controller and the current leak circuit to achieve the target leakage value for each corner-case. In another aspect, the target leakage value and the target voltage value may be received as inputs from one of a user interface and another programming device.

Further aspects include a method of providing more uniform power performance of a group of production integrated circuits (ICs) having a current leak circuit and a leakage-add controller coupled to the current leak circuit by receiving information regarding a distribution of power performance of the group of production ICs, determining a preferred power distribution for the group of production ICs based on the information, selecting an IC in the group of production ICs, determining power characteristics of the selected IC, determining preferred power characteristics for the selected IC based on the preferred power distribution, and programming the selected IC's leakage-add controller to control the current leak circuit in order to implement the preferred power characteristics on the selected IC. In an aspect, programming the selected IC's leakage-add controller to control the current leak circuit in order to implement the preferred power characteristics on the IC may include programming the selected IC's leakage-add controller prior to installation of the selected IC into a device.

In another aspect, receiving information regarding a distribution of power performance of the group of production ICs may include receiving information regarding power usage of devices in which the group of production ICs are installed and programming the selected IC's leakage-add controller to control the current leak circuit in order to implement the preferred power characteristics on the IC may include programming the leakage-add controller after installation of the IC into a device.

Further aspects include a system that may include means for receiving information regarding a distribution of power performance of a group of production integrated circuits (ICs), wherein each of the group of production ICs may include a current leak circuit and a leakage-add controller coupled to the current leak circuit, means for determining a preferred power distribution for the group of production ICs based on the information, means for selecting an IC in the group of production ICs, means for determining power characteristics of the selected IC, means for determining preferred power characteristics for the selected IC based on the preferred power distribution, and means for programming the selected IC's leakage-add controller to control the current leak circuit in order to implement the preferred power characteristics on the selected IC. In another aspect, means for programming the selected IC's leakage-add controller to control the current leak circuit in order to implement the preferred power characteristics on the IC may include means for programming the selected IC's leakage-add controller prior to installation of the selected IC into a device.

In another aspect, means for receiving information regarding a distribution of power performance of the group of production ICs may include means for receiving information regarding power usage of devices in which the group of production ICs are installed and means for programming the selected IC's leakage-add controller to control the current leak circuit in order to implement the preferred power characteristics on the IC may include means for programming the leakage-add controller after installation of the IC into a device.

BRIEF DESCRIPTION OF THE DRAWINGS

The accompanying drawings, which are incorporated herein and constitute part of this specification, illustrate exemplary aspects of the invention, and together with the general description given above and the detailed description given below, serve to explain the features of the invention.

FIG. 1A is a table illustrating a natural distribution of a batch of ICs based on operational speed.

FIG. 1B is an table illustrating a natural distribution of integrated circuits sorted into performance bins based on operational speed and sorted within each performance bin based on current leakage.

FIG. 5B is an equation for use when calculating an additional amount of leakage needed on the IC to match a target leakage value.

DETAILED DESCRIPTION

Figure 2:
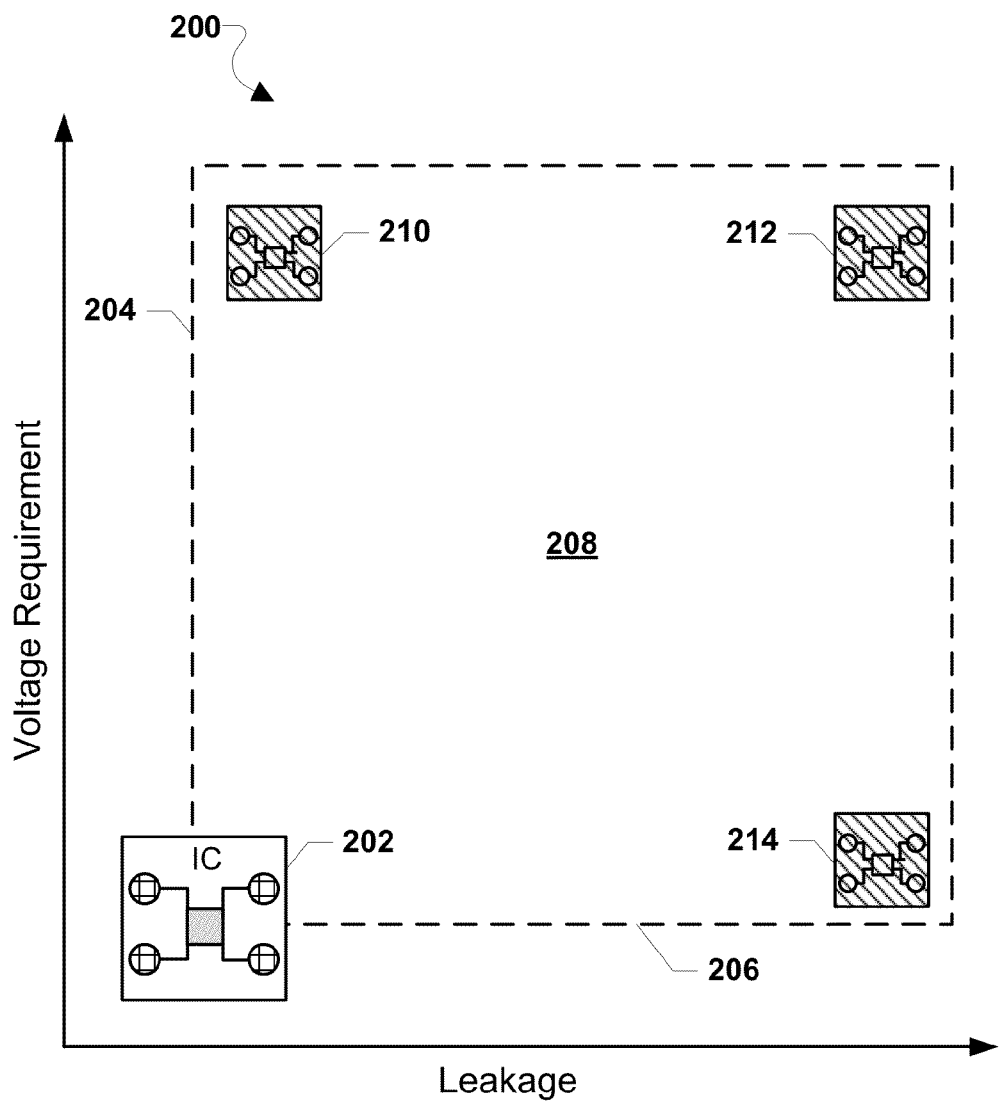
FIG. 2 is a graph illustrating the emulation capabilities of an aspect IC.

The various aspects will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

As used herein, the term "integrated circuit" and "IC" are used interchangeably and refer to a set of electronic circuits on one small plate ("chip") of semiconductor material, such as silicon. In the various aspects, ICs may include, but are not limited to, chips, microchips, wafer-scale integration systems, systems-on-a-chip integrated circuits (sometimes referred to herein as an "SOC"), three-dimensional integrated circuits, and other integrated circuit systems. For example, an IC may be an SOC that includes, among other things, a central processing unit, a digital signal processing unit, and memory. In another example, an IC may be a component part of an SOC, and the SOC may include multiple ICs.

As used herein, the terms "silicon leakage," "leakage," "IDDQ," and "leakage current" are used interchangeably and refer to a gradual decrease of electric current that naturally occurs in ICs.

As used herein, the terms "operational speed" and "operational frequency" are used interchangeably and refer to the performance frequency (e.g., MHz) that an IC is capable of achieving at a given voltage. Similarly, the term "voltage requirement" as used herein refers to the amount of voltage an IC requires to obtain a given performance frequency.

As used herein, the term "corner-case parameter" refers to a leakage value and a voltage requirement value that together represent a particular corner-case IC in a batch of ICs. For example, a particular corner-case parameter may represent an IC with an extremely high leakage current and an extremely high voltage requirement.

As discussed above, manufacturers of devices that use ICs must perform their own testing of new designs to confirm that designs meet their own and governmental performance and safety standards/limits. Given the natural variation in ICs, device manufacturers install corner-case ICs in their devices and test the thermal/power characteristics of their products when installed with corner-case ICs to ensure their products' quality. To do this, device manufactures currently require IC manufacturers to provide them with multiple corner-case ICs so the corner-case ICs can be soldered into their test devices (i.e., "test systems").

Thus, because of the inherent variability of the physical characteristics of ICs, contemporary methods of performing thermal/power testing, such as those described above, require IC manufacturers to spend substantial resources finding ICs suitable for corner-case testing on a test system and require device manufacturers to spend considerable time and effort installing and testing these multiple corner-case ICs on numerous test systems during power/thermal testing.

In overview, the various aspects provide for an IC design and methods for utilizing the IC design to emulate corner case ICs during power/thermal testing of a test system by installing a specially chosen IC on the test system. In various aspects, this specially chosen IC may be a fully functioning IC that also includes a leakage-add controller and one or more current leak circuits. The one or more current leak circuits may simulate additional current leakage on the IC and may be driven by the leakage-add controller. The chosen IC may also include a programmable voltage table for adjusting the chosen IC's operational voltage. The various aspects therefore provide for using a single IC to emulate the thermal characteristics of various corner-case ICs while performing normal IC activities on the test system during power/thermal testing, thereby eliminating current limitations in thermal/power testing of test systems due to the difficulty of providing corner-case ICs, and installing and testing those corner-case ICs on various test systems.

In the various aspects, an IC that includes a leakage-add controller, current leak circuits, and a programmable voltage table may be fully functional such that the IC may be capable of operating as a typical IC (e.g., executing software instructions, etc.). In other words, the inclusion of the leakage-add controller, one or more current leak circuits, and a programmable voltage table into an IC may enable the IC to perform operations in addition to normal activities that are typical of similar ICs.

In an aspect, the leakage-add controllers and current leak circuits may be built into the ICs during production so that the leakage-add controller and current leak circuits may be activated during power/thermal testing of test systems by toggling a switch and deactivated after testing. In another aspect, current leak circuits may be included in ICs in preproduction lots (i.e., early lots used for testing and demonstrations), but left out of subsequent production lots. The IC's overall capability to function similarly to typical ICs in a device or product may be unaffected by the presence or absence of leakage-add controller and/or current leak circuits, but the leakage-add controller and the current leak circuits may be useful in changing the IC's thermal/power characteristics during normal IC activities.

In an aspect, a programming device (e.g., a laptop computer configured to conduct thermal/power testing of a test system) may receive information about a batch of ICs. The batch information may include the current leakage values and voltage requirements for each IC in a batch. In a further aspect, the programming device may identify a plurality of corner-case parameters (i.e., extreme current leakage and/or voltage requirements associated with corner-case ICs identified in the batch) based on the batch information. In another aspect, the programming device may select an IC in the batch that has ideal or near-ideal thermal/power characteristics—such as a low silicon leakage and a low voltage requirement—relative to other ICs in the batch. This selected IC may be useful in implementing the plurality of identified corner-case parameters during testing of the test system.

In an aspect, the selected IC may be installed on a test system and may be used during performing thermal/power testing of the test system. The selected IC may be a fully functioning IC capable of executing typical software instructions or otherwise operating as a typical IC on the test system. For example, the selected IC may be used to perform typical thermal/power testing (e.g., running particularly computationally-intensive software instruction). In another example, the selected IC may be a CPU, and the selected IC may be capable of executing testing software, providing instructions to other components on the test system, or various other operations performed by typical CPUs. In another aspect, after the IC is installed on a test system, the programming device may send corner-case parameters to the IC to enable the IC to emulate the corner-case ICs associated with those corner-case parameters on the test system during power/thermal testing. As discussed above, the selected IC may change its current leakage and applied voltage while still performing normal activities typical of similar ICs.

In an aspect, the leakage-add controller and/or a processing unit operating on an IC may receive a corner-case parameter from the programming device, and the corner-case parameter may include the current leakage value for a particular corner-case IC (i.e., a target leakage value). The leakage-add controller and/or the processing unit may signal the one or more current leak circuits to increase the IC's current leakage to match a target leakage value. In another aspect, the IC may also receive a target voltage value as part of the corner-case parameter, and the leakage-add controller and/or the processing unit may instruct a programmable voltage table to increase the voltage at which the IC is operating to match the target voltage value.

In a further aspect, the leakage-add controller may receive a target leakage value from the processing unit or directly from the programming device. In order to implement the target leakage value on the IC, the leakage-add controller may calculate an additional leakage amount based on a target leakage value and the IC's actual current leakage value. The leakage-controller may also direct one or more current leak circuits to draw the calculated amount of additional leakage, thereby simulating the target leakage value on the IC.

In an aspect, the leakage-add controller may be implemented in hardware. In further aspects, the leakage-add controller may be a collection of software instructions executed by a processing unit operating on the IC.

Thus, in the various aspects, an IC may be capable of implementing various combinations of target leakage and target voltage values (i.e., corner-case parameters) while performing typical IC operations. Through implementing these various corner-case parameters, the IC may enable a test system to experience thermal/power levels characteristic of various corner-case ICs represented by the corner-case parameters without having to install a different IC for each corner-case scenario. Because the ICs may emulate corner-case ICs while still operating as a fully functional component of the test system (e.g., CPU, GPU, modem, etc.), the various aspects provide significant advantages over current methods of thermal/power testing by reducing the time and effort of identifying corner-case ICs, and installing and testing those corner-case ICs on test systems during thermal/power testing.

The IC may also enable other testing entities to conduct additional (e.g., confirmatory) testing of test systems without having to reuse (and potentially damage) particular ICs. In other words, by including ICs in test systems, testing entities may reproduce the same situation for testing without using the same test system or ICs. For example, a first testing facility may run thermal/power testing software on a first IC installed on a first test system for numerous different corner cases. The first testing facility may send these corner cases to a second facility (e.g., by email), and the second facility may attempt to reproduce those tests on a second test system that includes a second IC by executing the same thermal/power testing software on the second IC for the same corner cases. The second facility may then be able to compare the results of the first and second IC test systems without having to receive and test the first test system or the first IC.

In further aspects, a programming device may configure ICs installed in a group of production systems (i.e., devices not used for testing) to use a leakage-add controller, programmable voltage table, and one or more current leak circuits to adjust the production ICs' thermal and operating frequency performance to reduce the variability among production ICs. In other words, the programming device may configure one or more of the production ICs to operate normally at pre-determined target leakage and voltage values when the one or more production ICs' measured current leakage, thermal performance and/or processing speed are significantly better than the batch average. Thus, by using the aspect current leak circuits, the programming device may adjust productions ICs with abnormally better current/thermal performance so those production ICs are closer to the average. By activating the current leak circuits in this way, the IC manufacturer can reduce the IC-to-IC power variability in the production batch to enable device manufacturers to make products that exhibit a more-uniform power performance and behavior.

FIGS. 1A and 1B illustrate a natural distribution of ICs in a batch of ICs. In various aspects, the leakage and voltage requirements of each IC in a batch may be measured, among other things, to determine the IC (or ICs) that exhibit optimal or near-optimal leakage and voltage requirement characteristics relative to other ICs in the batch. In further aspects, these ICs may be selected to emulate the leakage/voltage characteristics of other ICs in the batch during thermal/power testing of a test system.

FIG. 1A is a table 100 illustrating a distribution of ICs in a batch based on their voltage requirements. In an aspect, each IC in a batch may have been previously tested to determine the amount of voltage that the IC requires (i.e., required voltage columns 104) to achieve a particular operating frequency (i.e., frequency column 102).

In an aspect, each IC in a batch may also be placed into a category or "bin" based on its voltage requirement/operational speed. As illustrated in FIG. 1A, to achieve an operation frequency of 700 MHz, ICs in each bin may require varying amounts of voltage. For example, ICs in Bin 1 may have slower natural operational frequencies than ICs in Bin 5 and may require more voltage to operate at 700 MHz. On the other hand, ICs in Bin 5 may have faster natural operational frequencies than ICs in any other bin and may require only 875 mV to operate at 700 MHz.

In an aspect, the fastest ICs 106 (represented in FIG. 1A as those ICs in Bin 5) may have the greatest operational range. In other words, for purposes of emulating other ICs, the fastest ICs 106 may match the operational speed of ICs in other bins for a given voltage, whereas ICs in other bins may be unable to match the fastest ICs 106 in Bin 5 at certain low voltages.

FIG. 1B is a table 110 illustrating a distribution of ICs in a batch based on bins (i.e., voltage requirement/operational speed) and current leakage. In an aspect, the ICs in each bin (i.e., bin column 112) may have been previously tested to determine the distribution of current leakage values present at a particular voltage for ICs in each bin (i.e., leakage columns 116). The number of devices per bin (i.e., column 114) may also be determined.

As discussed above with reference to FIG. 1A, the ICs may be separated into bins based on their voltage requirements/operational speeds. In table 110, ICs in Bin 1 may exhibit the slowest processing speed (i.e., require more voltage to achieve a specified speed/operational frequency), and Bins 2-5 may represent ICs with increasing operations speeds such that ICs in Bin 5 are the fastest ICs in the batch.

In an aspect, statistics related to the natural variation of silicon leakage of the ICs in each bin may also be calculated. For example, as illustrated in table 110, it may be determined that 1% of ICs in Bin 2 have silicon leakage values less than or equal to 54 microamps and 95% of ICs in Bin 2 have silicon leakage values less than or equal to 100 microamps.

In an aspect, a programming device may receive the information included in table 110 and may determine one or more corner-case parameters based on the natural distributions of the ICs in the batch. For example, the programming device may determine that ICs with naturally low leakage properties (i.e., 1% ICs 118) may be candidates for corner-case testing. In another aspect, the programming device may define corner cases based on leakage values for different bins. Thus, in an example, a programming device may determine three corner cases (e.g., 1% ICs 118, average ICs, and 99% ICs 120) for each bin, for a total of fifteen corner cases. In further aspects, the programming device may define additional corner cases based on various other combinations of operational speed/bin and leakage values.

In another aspect, the programming device may receive raw information regarding the current leakage and voltage requirements for each IC in the batch, and the programming device may calculate various statistics (e.g., the information included in table 110) and use this information to determine corner cases in the batch.

In an aspect, the programming device may select an IC determined to have the best current leakage and operational speed characteristics in a batch of ICs for use in, among other things, emulating other ICs in the batch on a test system during thermal/power testing. For example, an IC in Bin 5 that is in the top 1% of leakage values (i.e., an IC in cell 122) may be used to emulate other ICs in the batch on a test system as discussed below with reference to FIG. 2. Thus, in addition to functioning as a regular IC on the test system, the selected IC may also simulate the thermal characteristics of various corner cases during testing of the test system.

FIG. 2 illustrates a graph 200 that represents the emulation capabilities of an IC. As illustrated in FIG. 2, an IC 202 may emulate any IC in a distribution area 208 defined by voltage requirement values 204 and leakage values 206. In other words, the IC may emulate ICs with larger silicon leakages and/or higher voltage requirements.

Thus, in an aspect, an IC used in power/thermal testing of a test system may be an IC with very low silicon leakage and fast operational performance frequencies/speeds (i.e., low voltage requirements) in order to emulate other, less optimal ICs. In other words, the IC may need to be an optimal or near-optimal IC (e.g., ICs in cell 122 of table 110 described above with reference to FIG. 1B) that can be programmed to have worse leakage and/or higher voltage to emulate other ICs in the batch (e.g., corner-case ICs) during testing of the test system.

In an aspect, IC 202 may emulate various corner-case ICs. For example, the IC 202 may emulate an IC 214 with a greater degree of silicon leakage by using a current leak circuit to simulate the effect of additional silicon leakage on the IC 202. In another example, the IC 202 may emulate another IC 210 that requires higher voltage by matching the voltage applied on the IC 202 with the IC 206's voltage value. In yet another aspect, the IC 202 may emulate another IC 212 by adding additional leakage and by increasing its applied voltage.

By selecting an IC with optimal/near-optimal leakage and voltage requirements, the greatest number of combinations of leakage and voltage requirements (i.e., corner cases) may be tested on a test system that includes that IC without having to install and uninstall a different IC (e.g., ICs 210, 212, 214) on the test system for each corner case.

Figure 3:
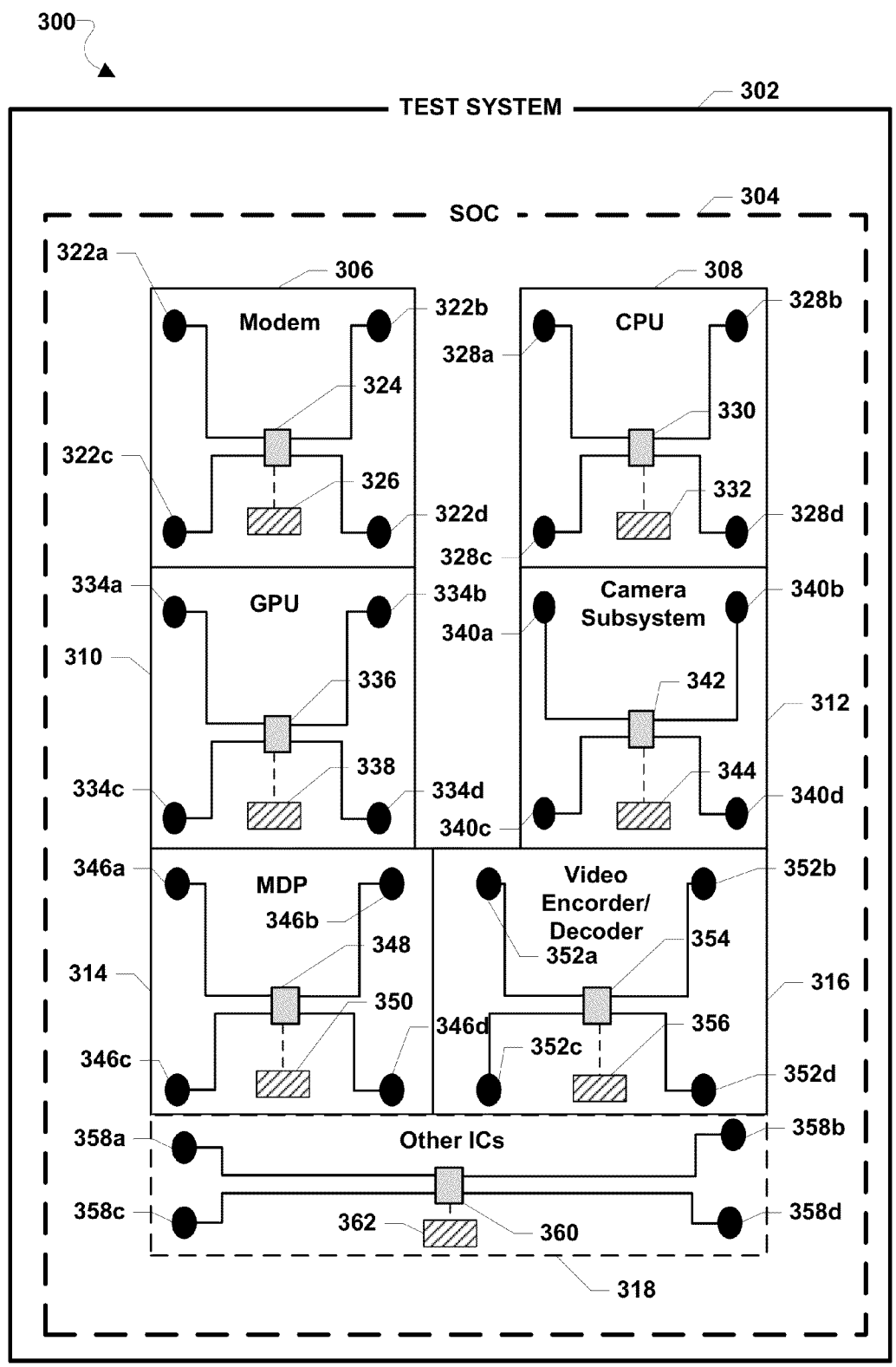
FIG. 3 is a component block diagram of an aspect test system that includes one or more ICs suitable for use in the various aspects.

FIG. 3 illustrates a component block diagram 300 of a test system that includes one or more ICs capable of adjusting their thermal power/characteristics according to an aspect.

In an aspect, a test system 302 may be one of various electronic computing devices, such as a mobile phone, a smart phone, a laptop computer, a desktop computer, etc. The test system 302 may include one or more ICs 306, 308, 310, 312, 314, 316, 318 that each perform a particular function. For example, the test system 302 may be a mobile computing device (e.g., a smart phone) having one or more of the following ICs: a CPU IC 308 (e.g., "CPU"), a modem IC 306 (e.g., "Modem"), a graphics CPU IC 310 (i.e., "GPU"), a camera subsystem IC 312, a media display processing unit 314 (i.e., "MDP"), a video encoder/decoder IC 316, and one or more other ICs 318 that serve various other purposes. As described above, each of the one or more ICs 306, 308, 310, 312, 314, 316, 318 in the test system 302 may be fully capable of performing the tasks for which it was designed. For example, the CPU IC 308 may execute various software instructions and perform other tasks typical of other CPUs, and the camera subsystem IC 312 may be configured to manage the operations of a camera (not shown) also included on the test system 302.

In an optional aspect, the ICs 306, 308, 310, 312, 314, 316, 318 may be included as components of a system-on-a-chip (i.e., SOC 304) included in the test system 302. In such an aspect, the ICs 306, 308, 310, 312, 314, 316, 318 may be attached to a common silicon substrate and may communicate with each other through conductive material included on the SOC 304.

As discussed above, testing entities may test the thermal characteristics, performance, and other attributes of the test system 302 during thermal/power testing. The overall performance/quality of the test system 302 may depend in part on the thermal characteristics of the one or more of the ICs 306, 308, 310, 312, 314, 316, 318. For example, the overall performance of the test system 302 may be adversely affected when one or more of the ICs 306, 308, 310, 312, 314, 316, 318 has an extreme voltage requirement and/or current leakage (i.e., is a corner-case IC). Thus, in an aspect, one or more ICs 306, 308, 310, 312, 314, 316, 318 on the test system 302 may include additional components to enable those ICs 306, 308, 310, 312, 314, 316, 318 to change their applied voltage and current leakage to enable testing entities to observe the performance/quality of the test system 302 when the ICs 306, 308, 310, 312, 314, 316, 318 have various voltage requirements and current leakage.

In an aspect, in addition to performing typical IC operations, one or more of the ICs 306, 308, 310, 312, 314, 316, 318 may include components that may enable them to adjust their thermal characteristics to emulate current leakage and voltage corner cases. In another aspect, to enable emulation of the thermal characteristics of other ICs (e.g., corner-case ICs), the ICs 306, 308, 310, 312, 314, 316, 318 may include, respectively, leakage-add controllers 324, 330, 336, 342, 348, 354, 360. The leakage-add controllers 324, 330, 336, 342, 348, 354, 360 may be coupled to current leak circuits 322a-322d, 328a-328d, 334a-334d, 340a-340d, 346a-346d, 352a-352d, 358a-358d, which are also included on the ICs 306, 308, 310, 312, 314, 316, 318.

In another aspect, the leakage-add controllers 324, 330, 336, 342, 348, 354, 360 may cause the current leak circuits 322a-322d, 328a-328d, 334a-334d, 340a-340d, 346a-346d, 352a-352d, 358a-358d to implement target leakage values. The current leak circuits 322a-322d, 328a-328d, 334a-334d, 340a-340d, 346a-346d, 352a-352d, 358a-358d may accomplish this, for example, by applying voltage from a voltage source through a resistor circuit (not shown). In an example, if the leakage-add controller 330 on the CPU IC 308 causes current leak circuits 328a-328d to implement a target leakage value, current leakage characteristics of the CPU IC 308 may be the same as a corner-case IC that naturally has a leakage value equal to the target leakage value.

Thus, in an aspect, by implementing the target leakage values, the ICs 306, 308, 310, 312, 314, 316, 318 may emulate corner-case ICs' current leakage, and thus, the effects of different leakage values on the ICs 306, 308, 310, 312, 314, 316, 318 may be observed on the test system 302 as a whole during thermal/power testing, thereby enabling testing entities to observe how different leakage values (e.g., corner case leakage values) affect the performance of the entire test system 302. The process of implementing a target leakage value is further discussed below with reference to FIGS. 5A and 5B.

In a further aspect, in order to better emulate the thermal characteristics of the various corner-cases, the current leak circuits 322a-322d, 328a-328d, 334a-334d, 340a-340d, 346a-346d, 352a-352d, 358a-358d may be located in various locations on the ICs 306, 308, 310, 312, 314, 316, 318 to distribute the generated heat in a manner more consistent with natural silicon leakage. This positioning is illustrated in FIG. 3, which shows current leak circuits 322a-322d, 328a-328d, 334a-334d, 340a-340d, 346a-346d, 352a-352d, 358a-358d positioned at various locations on the ICs 306, 308, 310, 312, 314, 316, 318, rather than at a single location.

In another aspect, as discussed above, the leakage-add controllers 324, 330, 336, 342, 348, 354, 360 and current leak circuits 322a-322d, 328a-328d, 334a-334d, 340a-340d, 346a-346d, 352a-352d, 358a-358d may be built into the ICs 306, 308, 310, 312, 314, 316, 318 during production so that the leakage-add controllers 324, 330, 336, 342, 348, 354, 360 and current leak circuits 322a-322d, 328a-328d, 334a-334d, 340a-340d, 346a-346d, 352a-352d, 358a-358d may be activated during power/thermal testing of the test system 302 by toggling a switch. In such an aspect, the leakage-add controllers 324, 330, 336, 342, 348, 354, 360 may be relatively simple circuits (e.g., simple gateways to the current leak circuits 322a-322d, 328a-328d, 334a-334d, 340a-340d, 346a-346d, 352a-352d, 358a-358d), and each IC in a batch may include the leakage-add controller and one or more current leak circuits.

In another aspect, the leakage-add controllers 324, 330, 336, 342, 348, 354, 360 may be more sophisticated because, for example, they are configured to perform various calculations and actively manage the application of additional leakage by current leak circuits 322a-322d, 328a-328d, 334a-334d, 340a-340d, 346a-346d, 352a-352d, 358a-358d. When the leakage-add controllers 324, 330, 336, 342, 348, 354, 360 are complex, the leakage-add controllers 324, 330, 336, 342, 348, 354, 360 and the current leak circuits 322a-322d, 328a-328d, 334a-334d, 340a-340d, 346a-346d, 352a-352d, 358a-358d may be included in ICs in preproduction lots (i.e., early lots used for testing and demonstrations), but left out of subsequent production lots. In this case, ICs in preproduction lots may be capable of performing the same typical functions as the ICs in subsequent production lots, but ICs in preproduction lots may also be capable of adjusting their voltage and leakage characteristics to facilitate thermal/power testing of test systems.

In another aspect, ICs 306, 308, 310, 312, 314, 316, 318 may each include a programmable voltage table 326, 332, 338, 344, 350, 356, 362. In a further aspect, the programmable voltage tables 326, 332, 338, 344, 350, 356, 362 may be coupled to the leakage-add controllers 324, 330, 336, 342, 348, 354, 360 and/or to another processing circuit/unit (not shown). The programmable voltage tables 326, 332, 338, 344, 350, 356, 362 may receive target voltage values from either the processing circuits/units or the leakage-add controllers 324, 330, 336, 342, 348, 354, 360 and may adjust the voltage currently being applied to the ICs 306, 308, 310, 312, 314, 316, 318 to match the received target voltage values. Thus, the programmable voltage tables 326, 332, 338, 344, 350, 356, 362 may facilitate dynamic thermal/power testing of test system 302 by changing the voltages of the ICs 306, 308, 310, 312, 314, 316, 318 to match target voltage values associated with corner-case ICs.

While FIG. 3 illustrates each of ICs 306, 308, 310, 312, 314, 316, 318 including a leakage-add controller, a programmable voltage table, and multiple current leak circuits, in further aspects, one or more of the ICs 306, 308, 310, 312, 314, 316, 318 may not include these additional components.

The ability of the one or more ICs 306, 308, 310, 312, 314, 316, 318 that do not include these additional components to perform typical IC functions in the test system 302 may not be affected by the absence of a leakage-add controller, a programmable voltage table, or a current leak circuit.

In another aspect (not shown), the individual ICs 306, 308, 310, 312, 314, 316, 318 may not include leakage-add controllers, programmable voltage tables, and current leak circuits, but the SOC 304 may include those component. In a further aspect, the SOC 304, in addition to functioning as a normal SOC, may utilize a leakage-add controller, programmable voltage table, and one or more current leak circuits to emulate corner case conditions for an entire SOC instead of individual power domains. In other words, the SOC 304 may emulate corner-case conditions for the ICs 306, 308, 310, 312, 314, 316, 318 as a whole.

Figure 4A:
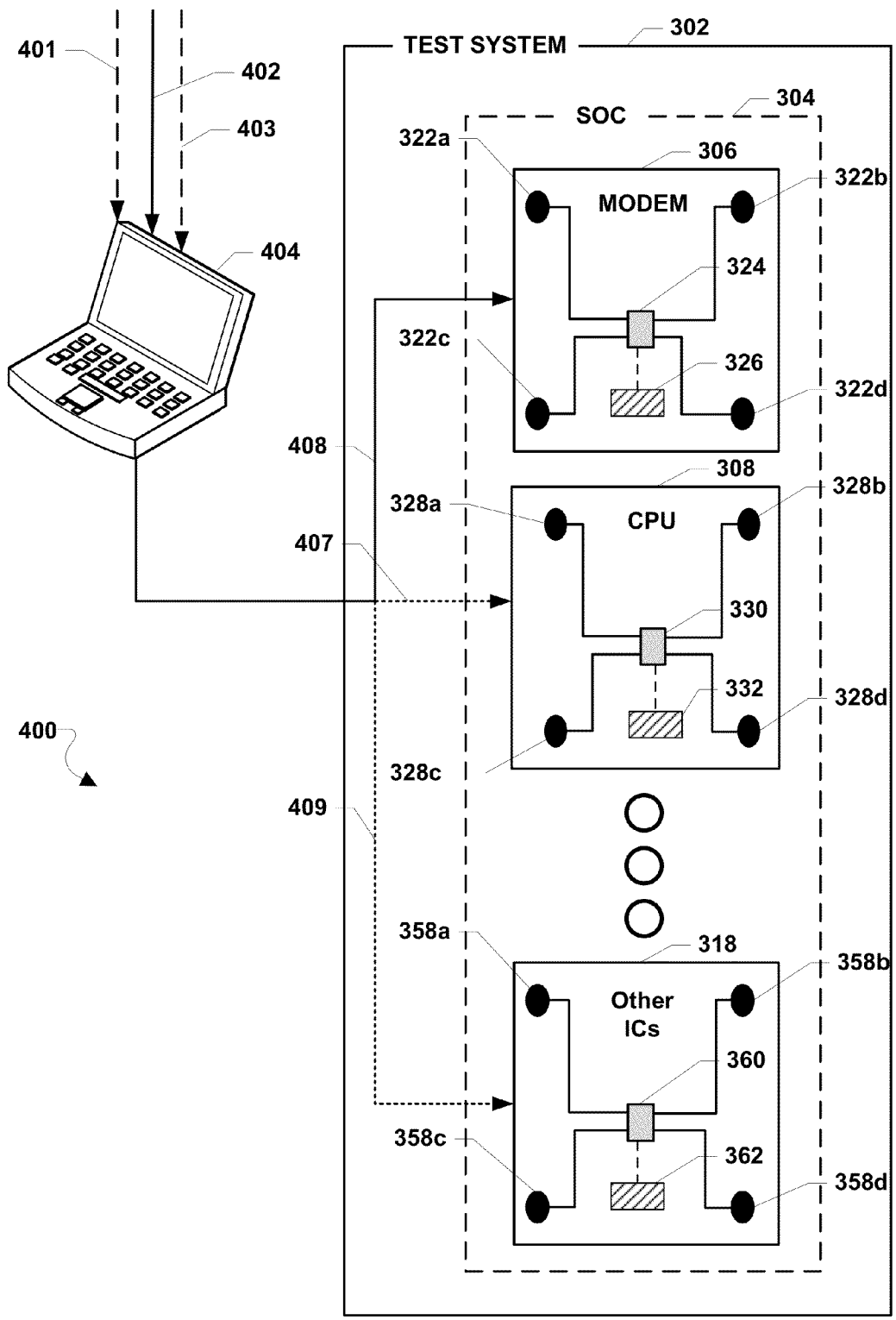
FIG. 4A is a system diagram illustrating receiving, translating, and sending corner-case parameters from a programming device for use in emulating corner-case ICs on a test system during power/thermal testing.
Figure 4B:
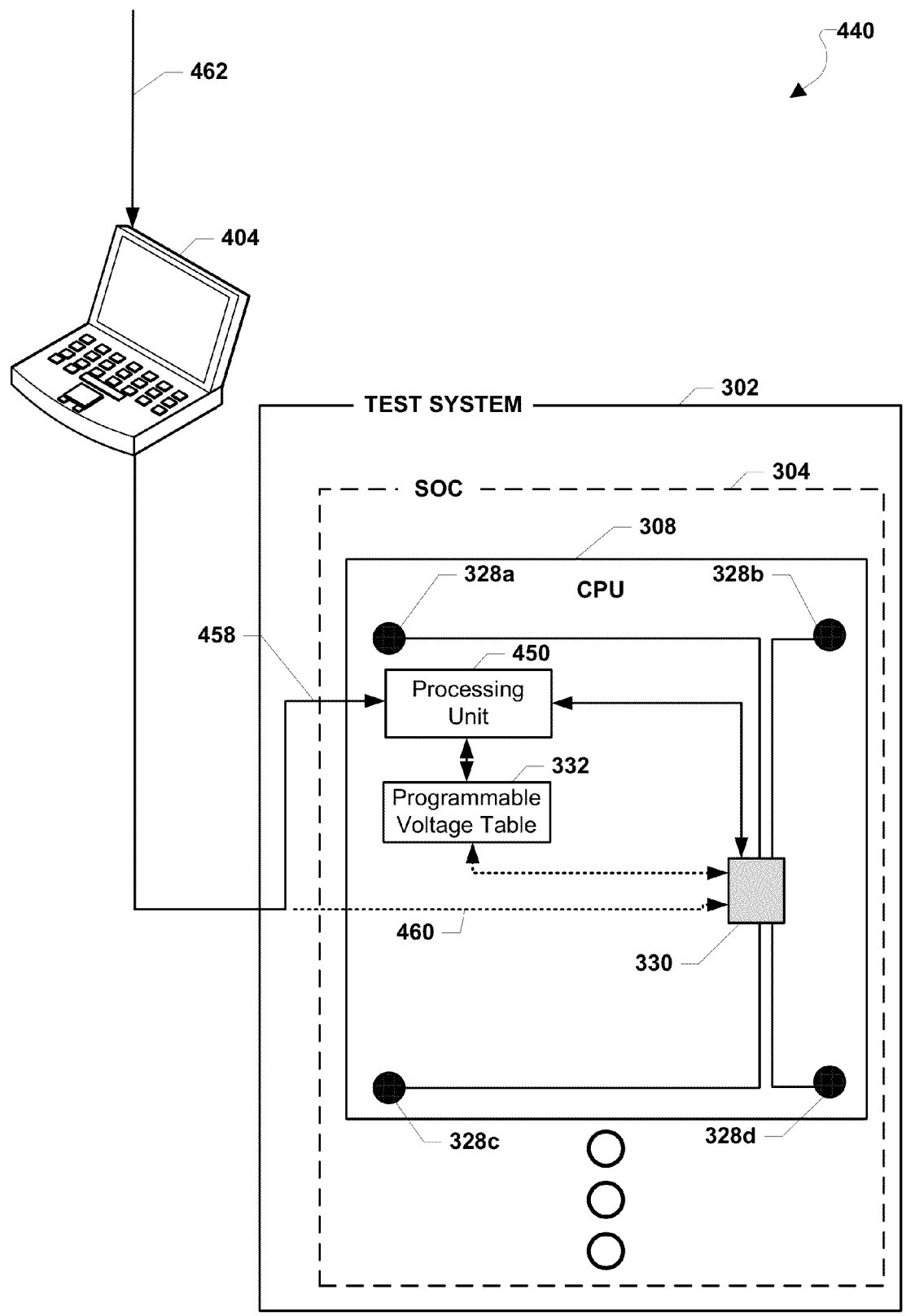
FIG. 4B is another system diagram illustrating receiving corner-case parameters with an IC installed on a test system for use in emulating corner cases on the test system.

FIGS. 4A and 4B illustrate aspect system diagrams 400, 440 of programming devices programming one or more ICs operating on a test system to emulate the power/thermal characteristics of various corner-case ICs.

FIG. 4A illustrates a system diagram 400 of a programming device 404 programming one or more separate ICs 306, 308, 318 included in a test system 302 to implement corner-case parameters.

In an aspect, after IC 306 is selected from among a batch of ICs as discussed above with reference to FIG. 1B, the IC 306 may be physically installed into a test system 302. For example, a modem IC 306 determined to have an ideal or near-ideal voltage requirement and lowest current leakage may be installed in the test system 302 at a testing facility. In an optional aspect, one or more other ICs (e.g., ICs 308, 310, 312, 314, 316, 318) may also be selected and installed on the test system 302. For example, the test system 302 may include a CPU IC 308 (i.e., "CPU") and an arbitrary number of other ICs 318. In another optional aspect, the ICs 306, 308, 318 may be included on a SOC 304, which may be installed on the test system 302. Each IC installed on the test system 302 may be fully functional and capable of performing operations typical of similar ICs.

In an aspect, when the test system 302 includes a plurality of ICs 306, 308, 318, each IC 306, 308, 318 may separately emulate corner cases for their respective types of ICs. For example, the modem IC 306 may emulate various corner-cases ICs in the batch of modems from which the modem IC 306 was selected. Thus, in a further aspect, testing entities may observe the thermal/power effects on the test system 302 as a whole resulting from different leakage/voltage values on a variety of different ICs (e.g., CPUs, graphical processing units, digital signal processors, SOC, etc.). Thus, thermal/power testing of the test system 302 may be accomplished by using one of each type of IC instead of installing and uninstalling multiple ICs of each type.

In an aspect, a programming device 404 may receive a corner-case parameter 402. In an aspect, the programming device 404 may receive the corner-case parameter 402 as part of information about a batch of ICs as described above with reference to FIG. 3. In an example, the programming device 404 may receive the corner-case parameter 402 from a user interface (not shown) used by a test engineer. In another example, the programming device 404 may receive the corner-case parameter 402 from another programming device (not shown), which may have conducted an earlier round of testing.

The corner-case parameter 402 may be any one of various combinations of voltage requirement values and leakage values (such as the values illustrated in table 110 described above with reference to FIG. 1B) to be emulated by the IC 306 on the test system 302. For example, the corner-case parameters 402 may represent a particular modem IC with extremely high leakage and slow operational speeds compared to other modem ICs in the same batch. In another aspect, the programming device 404 may optionally receive other corner-case parameters 401, 403 intended for other ICs on the test system 302, such as the CPU IC 308 and the other ICs 318, respectively.

After receiving the corner-case parameter 402, the programming device 404 may translate the corner-case parameters 402 into an instruction signal 408 that is sent to the IC 306. In an aspect, the instruction signal 408 may include instructions or information about the corner-case parameter 402, such as the target voltage and leakage values to be implemented on the IC 306. Similarly, in further aspects, the programming device 404 may translate corner-case parameters 401, 403 into instructions signals 407, 409 and respectively send those instruction signals 407, 409 to the CPU IC 308 and to the other ICs 318, thereby enabling ICs 308, 318 to emulate corner-case ICs represented by the corner-case parameters 401, 403.

In an aspect, the programming device 404 may send the instruction signal 408 to a processing unit/circuit (not shown) included in the IC 306. In such an aspect, the processing unit may decode the instruction signal 408 to determine a target leakage value and a target voltage value. The processing unit may configure the leakage-add controller 324 included in the IC 306 to use one or more current leak circuits 322a-322d to implement the target leakage value. For example, a leakage-add controller may be a simple circuit that serves as an intermediary between the processing unit and the one or more current-leak circuits. In another aspect, the processing unit may configure a programmable voltage table 326 to emulate the target voltage value.

Similarly, in another aspect, processing units (not shown) respectively operating on a the CPU IC 308 and the other ICs 318 may receive and decode instruction signals 407, 409, to determine target voltage values and target leakage values. The processing units in CPU IC 308 and the other ICs 318 may respectively configure leakage-add controllers 330, 360 to cause one or more current leak circuits 328a-328d, 358a-358d to emulate the target leakage values. The processing units may also respectively configure programmable voltage tables 426, 436 to emulate the target voltage values.

FIG. 4B illustrates another aspect system diagram 440 of a programming device 404 sending corner-case parameters to various components on a CPU IC 308 to enable the CPU IC 308 to emulate corner-case ICs associated with the corner-case parameters on a test system 302.

In an aspect, a CPU IC 308 may include various discrete components, such as a processing unit 450. As described above, the CPU IC 308 may also include a leakage-add controller 330 coupled to one or more current leak circuits 328a-328d. The leakage-add controller 330 may optionally be in communication with a programmable voltage table 332 also included on the CPU IC 308.

In an aspect, the programming device 404 may receive one or more corner-case parameters and send a translated signal to the CPU IC 308 as described above with reference to FIG. 4A. For example, the corner-case parameter 462 may include a target leakage value and a target voltage value that represents a particular corner-case IC (e.g., a CPU IC with a very high voltage requirement and very low leakage).

In an aspect, the programming device 404 may send an instruction signal 458 including a target leakage value and a target voltage value to a processing unit 450 operating on the CPU IC 308. In such an aspect, the processing unit 450 may decode the instruction signal 458, calculate an additional leakage amount required to match the target leakage value included in the instruction signal 458, and instruct a leakage-add controller 330 included in the CPU IC 308 to cause the one or more current leak add circuits 328a-328d to draw enough current so that the CPU IC 308's actual leakage matches the target leakage value.

In another aspect, the processing unit 450 may receive and decode the instruction signal 458 from the programming device and may send a target leakage value included in the instruction signal 458 to the leakage-add controller 330. In a further aspect, the leakage-add controller 330 may calculate the additional leakage amount require to match the target leakage value and may instruct the one or more current leak circuits 328a-328d to raise the CPU IC 308's actual leakage current to match the additional leakage amount.

In a further aspect, the processing unit 450 may be in communication with a programmable voltage table 332. After determining the target voltage value in the instruction signal 458, the processing unit 450 may instruct the programmable voltage table 332 to raise the voltage applied on the CPU IC 308 until it equals the target voltage value. Thus, by causing the leakage-add controller 330 to implement the target leakage value and by instructing the programmable voltage table 332 to implement the target voltage value, the processing unit 450 may emulate a corner-case IC represented by the values included in the corner-case parameter 462.

In an optional aspect, the programming device 404 may send an instruction signal 460 directly to the leakage-add controller 330. The leakage-add controller 330 may receive and decode the instruction signal 460, calculate an additional leakage amount required to match the target leakage value included in the instruction signal 460, and cause the one or more current leak circuits 328a-328d to implement the additional leakage amount. In a further aspect, the leakage-add controller 330 may configure a programmable voltage table 332 to emulate a target voltage value included in the instruction signal 460 by matching the voltage applied on the CPU IC 308 with the target voltage value. In other words, the leakage-add controller may directly manage the implementation of corner-case parameters on the CPU IC 308.

In the above descriptions, the leakage-add controller 330 and the processing unit 450 are described as separate components operating on the CPU IC 308. In another aspect (not shown), the leakage-add controller may be a set of software instructions executed by the processing unit, and it is anticipated that the above descriptions of operations performed by the leakage-add controller may be performed by executing the leakage-add controller software on the processing unit.

Figure 5A:
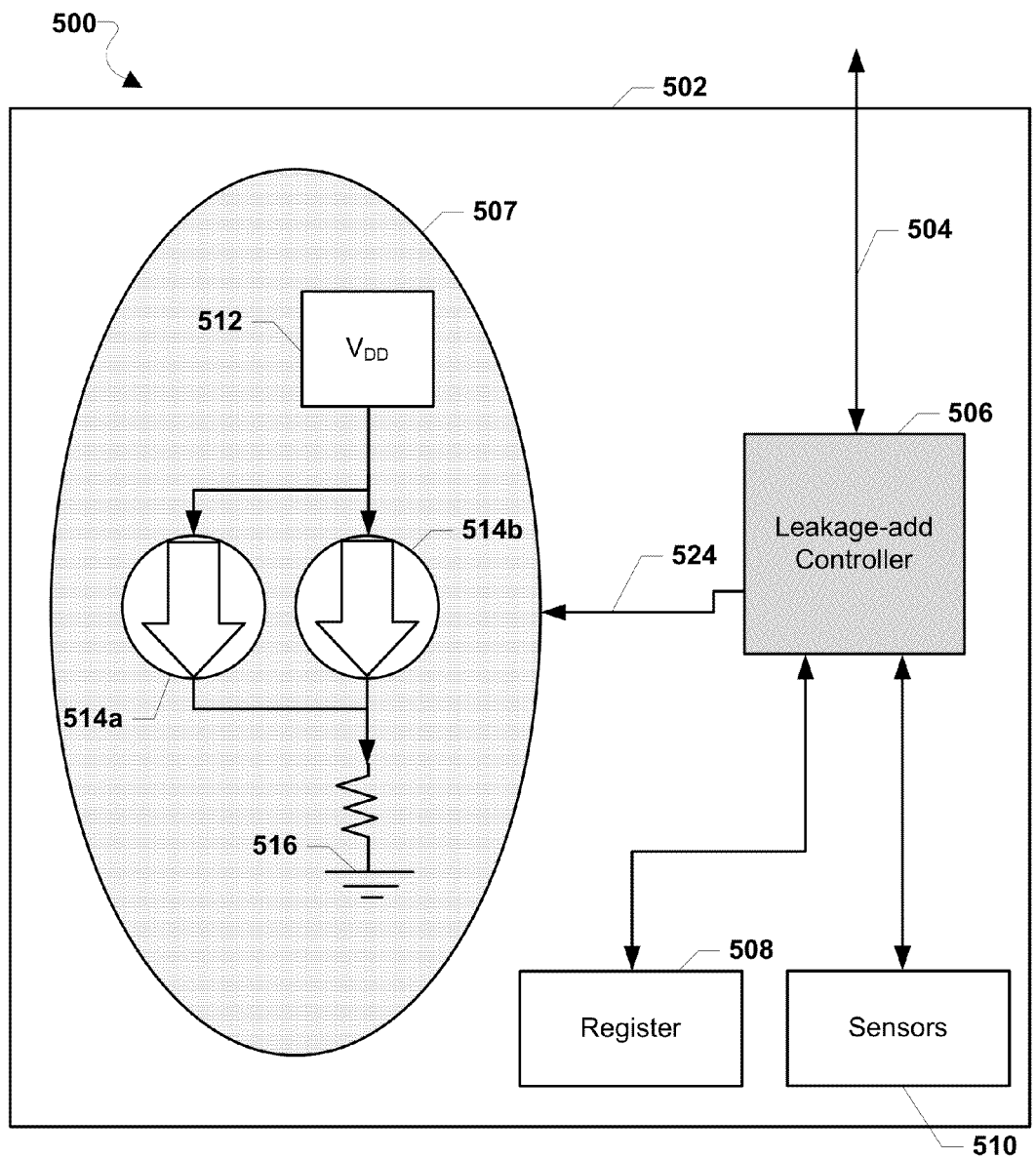
FIG. 5A is a component block diagram of an aspect IC that includes a leakage-add controller and a current leak circuit.

FIG. 5A illustrates a component diagram 500 of an aspect IC 502 including a leakage-add controller 506 and a current leak circuit 507. In addition to performing typical IC operations, the IC 502 may emulate corner-case ICs for a single component/power domain as described with reference to FIG. 4A (e.g., modem IC 306). In another aspect, the IC 502 may be a SOC configured to emulate corner cases for the entire SOC rather than individual ICs.

In an aspect, the leakage-add controller 506 may receive a signal 504 that causes the leakage-add controller 506 to instruct one or more current leak circuits—such as current leak circuit 507—to emulate a target leakage value. For example, the signal 504 may include a corner-case parameter defined by a target voltage value and a target leakage value representative of a particular corner-case IC to be emulated on the IC 502 as part of thermal/power testing of a test system. In an aspect, the leakage-add controller 506 may receive the signal 504 from a processing unit (not shown) operating on the IC 502. In another aspect, the leakage-add controller 506 may have received a target leakage value directly from a programming device, such as programming device 404 described above with reference to FIGS. 4A and 4B.

In an aspect, in response to receiving the signal 504, the leakage-add controller 506 may determine an additional amount of leakage needed to emulate the target leakage value by calculating the difference between the target leakage value and the IC 502's actual leakage value. Because every IC naturally has some current leakage, the leakage-add controller 506 may offset the target leakage value by the leakage the IC 502 naturally experiences. Thus, as discussed above, it may be important that the IC 502 has a naturally low leakage because the IC 502 may add additional leakage to emulate a target leakage value, but the IC 502 may not be capable of removing leakage if the target leakage value is lower than the IC 502's natural leakage.

In an aspect, the leakage-add controller 506 (or processing unit) may implement the equation 530 illustrated in FIG. 5B when computing the additional leakage needed to emulate the target leakage value. In an aspect, the target leakage value 532 (i.e., "$I_{leakage}$") may be the sum of the scaled actual leakage value 534 of the IC 502 (i.e., "$IDDQ_{actual} \cdot \lfloor e^{m \cdot (V-V_{ref})+n \cdot (T-T_{ref})} \rfloor$") excluding the current leak circuit 507 portion and the scaled additional leakage value 536 (i.e., "$IDDQ_{additional} \cdot \lfloor e^{m \cdot (V-V_{ref})+n \cdot (T-T_{ref})} \rfloor$") of the current leak circuit 507.

In an aspect, the leakage-add controller 506 may be in communication with a register 508 on the IC 502 that stores the IC 502's actual leakage value 540 (i.e., "$IDDQ_{actual}$"). In a further aspect, the actual leakage value 540 may have been previously calculated either by the leakage-add controller 506 or a processing unit and stored in the register 508. The leakage-add controller 506 may request information about the actual leakage value 540 from register 508. In another aspect, instead of receiving a pre-calculated actual leakage value 540 from the register 508, the leakage-add controller 506 (or a processing unit) may determine the actual leakage value 540 of the IC 502 dynamically (i.e., on the fly) based on information received from other components (not shown) operating on the IC 502. In a further aspect, a processing unit on the IC 504 may calculate the actual leakage value 540 and send the actual leakage value 540 to the leakage-add controller as part of the signal 504.

In another aspect, the leakage-add controller 506 may scale the actual leakage value 540 to account for the effects of temperature and voltage on the IC 502 by utilizing a scaling factor 538 (i.e., $\lfloor e^{m \cdot (V-V_{ref})+n \cdot (T-T_{ref})} \rfloor$) that accounts for these effects. In a further aspect, the scaling factor may be the floor of the exponential function of the term "$m \cdot (V-V_{ref})+n \cdot (T-T_{ref})$," wherein m and n are derived from a characterization of the silicon of the IC 502, wherein $T_{ref}$ and $V_{ref}$ are reference temperature and voltage values, and wherein T and V are determined based on temperature and voltage readings, respectively, received from one or more sensors 510 operating on the IC 502. In a further aspect, the leakage-add controller 506 may utilize the temperature and voltage information readings to calculate the scaling factor 538, thereby enabling the leakage-add controller 506 to more accurately emulate the effects of the leakage on the IC 502. Thus, the leakage-add controller 506 may use the scaling factor 538 to scale the actual leakage value 540 to determine the scaled actual leakage value 534. The leakage-add controller 506 may also multiply the scaling factor 538 with the additional leakage value 542 (i.e., an initial value calculated using a target leakage value) to calculate the scaled additional leakage value 536.

Returning to FIG. 5A, after calculating the scaled additional leakage value 536, the leakage-add controller 506 may send an instruction signal 524 to one or more current leak circuits, such as current leak circuit 507. In an aspect, the instruction signal 524 may include instructions to configure the current leak circuit 507 to draw certain amount of current equal to the calculated scaled additional leakage value 536.

In an aspect, the current leak circuit 507 may include various components for use in drawing current equal to the scaled additional leakage value 536 on the IC 502. The current leak circuit 507 may include a voltage source 512 (i.e., $V_{DD}$) that sends current through one or more resistor circuits 514a, 514b to ground 516. In an aspect, the current leak circuit 507 may cause the voltage source 512 and the resistor circuits 514a, 514b to draw enough current to ground 516 to equal the scaled additional leakage value 536, thereby emulating the target leakage value 532 on the IC 502.

In further aspects, the IC 502 may implement various other target leakage values through the same or substantial similar process described above. Thus, the IC 502 may enable test engineers or other users to emulate various corner-case ICs on the IC 502 while testing a test system without having to use multiple ICs.

Figure 6:
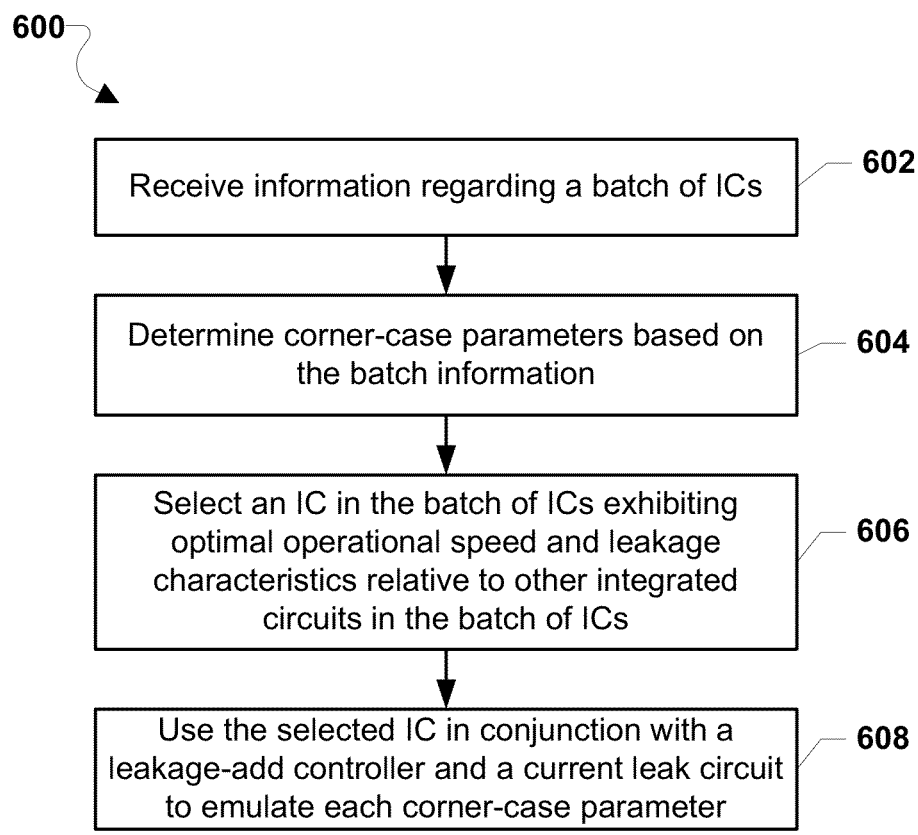
FIG. 6 is a process flow diagram illustrating an aspect method for selecting an IC in a batch of integrated circuits capable of emulating various corner-case ICs on a test system.

FIG. 6 illustrates an aspect method 600 that may be implemented by a programming device for selecting an IC for emulating corner-case ICs in a batch of ICs. In an aspect, each IC in the batch may be fully functional. In other words, the ICs may be used to perform actual operations or operations of typical ICs on a product or test system. In a further aspect, each IC in the batch may include components for emulating corner-case ICs (e.g., a leakage-add controller, programmable voltage table, and one or more current leak circuits). The batch of ICs may be a preproduction batch (i.e., the emulation components are not in subsequent batches), or the emulation components may be in every batch of ICs and activated only during thermal/power testing.

In block 602, the programming device may receive information regarding a batch of ICs. In an aspect, the batch information may include various raw measurements of a voltage requirement (e.g., a bin designation) and a silicon leakage value for each IC in the batch. In another aspect, the batch information may include statistical information derived from raw measurements (e.g., the information included in table 110 described above with reference to FIG. 1B).

In another aspect, the programming device may receive information that includes predetermined corner cases. For example, the programming device may receive a list of corner cases from another programming device at another testing facility. In such an aspect, conducting thermal/power testing of a test system may be expedited because pre-determined corner cases may be shared between testing entities instead of having to determine the corner cases at each testing facility.

In block 604, the programming device may determine corner-case parameters based on the batch information. In an aspect, the batch information may include voltage requirements/operational speeds and leakage values of each IC in a batch, and the programming device may analyze those values to determine one or more corner-case parameters. In an aspect, the corner-case parameters may represent ICs that exhibit various combinations of voltage requirements and leakage values. For example, one corner-case parameter may represent an IC that has a high operational speed and a high leakage value relative to other ICs in the same batch. Another corner-case parameter may represent another IC that has a relatively low operational speed and a low leakage value.

In another aspect, the batch information may include pre-determined corner-case parameters, and the programming device may identify corner-case parameters in the batch information without analyzing specific voltage requirement or leakage values. For example, the programming device may be used during a second round of testing (e.g., confirmation testing), and the programming device may receive a list of corner-case parameters that another programming device previously determined during a first round of testing.

In block 606, the programming device may select an IC in the batch of ICs exhibiting optimal operational speed and leakage characteristics relative to other integrated circuits in the batch of ICs. In an aspect, the programming device may select the IC in the batch with the lowest leakage value and the fastest operational speed/lowest voltage requirement value because that IC may be capable of emulating the greatest number of corner-cases ICs.

In block 608, the programming device may use the selected IC in conjunction with a leakage-add controller and a current leak circuit to emulate each corner-case parameter. In other words, the programming device may program the selected IC to implement the power characteristics of each corner-case parameter with a leakage-add controller and one or more current leak circuits included in the selected IC. Using the selected IC to implement each corner-case parameter is further described below with reference to FIG. 7.

In another aspect (not shown), the selected IC may be physically installed on a test system for emulating various corner cases ICs while performing normal operations on the test system (e.g., executing software instructions, etc.).

Figure 7:
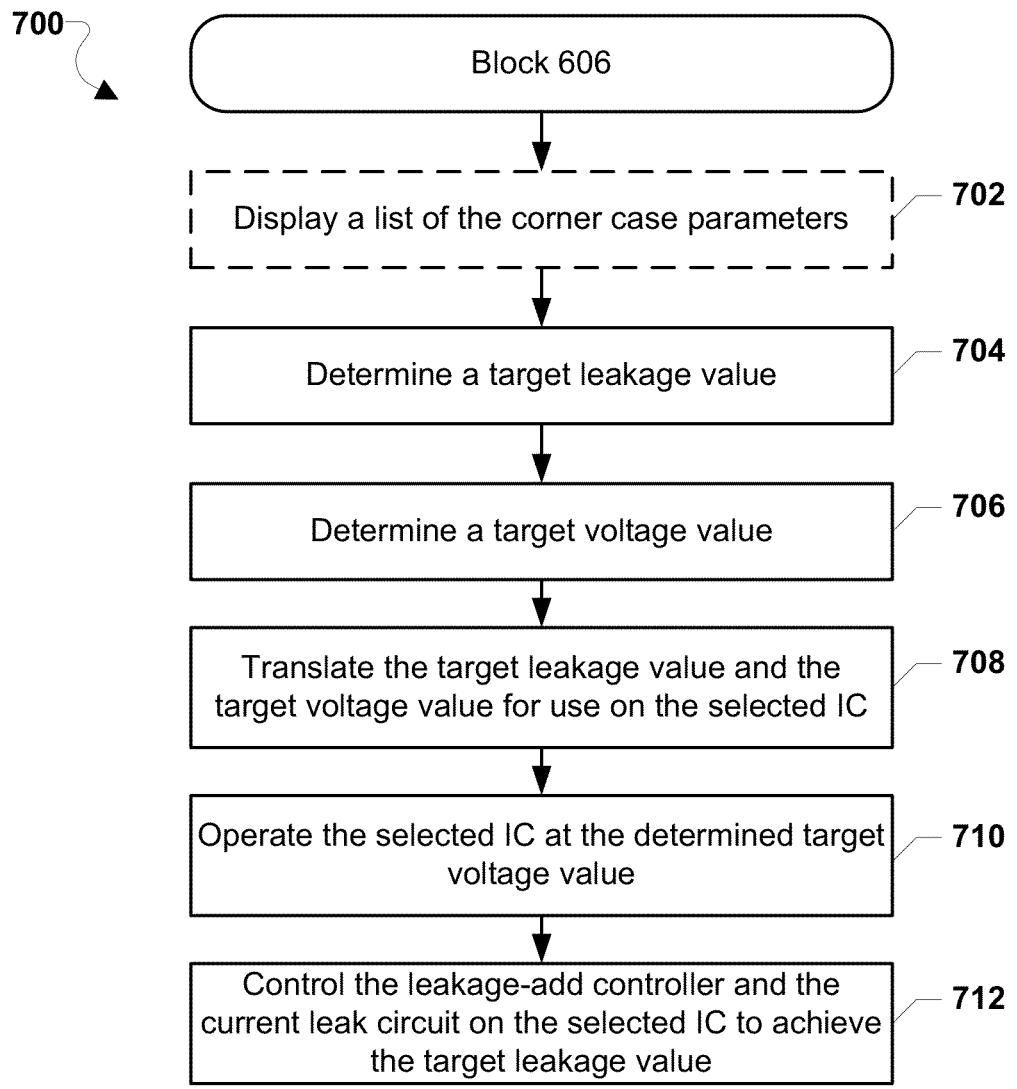
FIG. 7 is a process flow diagram illustrating an aspect method for sending corner-case parameters from a programming device to an IC.

FIG. 7 illustrates an aspect method 700 implemented on a programming device 404 for sending instructions regarding corner-case parameters to an IC 502 installed on a test system to enable the IC 502 to implement the corner-case parameters while performing normal operations during thermal/power testing of the test system. The operations of method 700 implement an embodiment of the operations of block 608 of method 600 described above with reference to FIG. 6. In an aspect, the programming device 404 may begin performing method 700 after selecting an IC in block 606 of method 600 described above with reference to FIG. 6 and after the selected IC is physically installed on a test system.

In optional block 702, the programming device 404 may display a list of the corner-case parameters. For example, the programming device 404 may display a table of extreme voltage requirements and/or leakage values for the ICs in the batch, such as the ranges and distributions illustrated in tables 100 and 110 described above with reference to FIGS. 1A and 1B. In an aspect, the programming device 404 may be configured to help a user (e.g., a test engineer) to design and generate the list of test cases for multiple target leakage and voltage values by showing the leakage/voltage ranges for the ICs in a batch, the range that the IC 502 can emulate (e.g., distribution area 208 described above with reference to FIG. 2), the distribution (or probability percentage) of IC population for specific leakage and voltage values, etc.

In block 704, the programming device 404 may determine a target leakage value. The programming device 404 may also determine a target voltage value in block 706. In an aspect, for each corner case, the programming device 404 may receive the target values from a user interface used by a test engineer during corner-case testing. For example, the programming device 404 may receive target values for each corner case to be tested, such as high voltage requirements/operational speed and high leakage, etc. In another aspect in which the programming device 404 displays a list of corner-case parameters, the programming device 404 may receive the target values as input from a user interface in the form of a selection of one of the displayed corner-case parameters. In another aspect, the programming device 404 may receive one or both of the target leakage value and the target voltage value from another programming device (e.g., a programming device at another testing facility).

In block 708, the programming device 404 may translate the target leakage value and the target voltage value for use on the IC 502. In an aspect, the programming device 404 may translate the target values into a form that a programmable voltage table circuit, processing unit, or a leakage-add controller 506 may understand and implement. For example, the programming device 404 may translate the target leakage value into a form the leakage-add controller 506 may utilize immediately or with minimum decoding by a processing unit on the IC 502.

In block 710, the programming device 404 may operate the selected IC at the determined target voltage value. In block 712, the programming device 404 may control the leakage-add controller and the current leak circuit on the selected IC to achieve the target leakage value. In an aspect, to cause the selected IC to implement the target voltage value and the target leakage value, the programming device 404 may send the translated target leakage value and the translated target voltage value to the IC 502. In another aspect, the programming device 404 may send the translated target leakage value and the translated target voltage value as a corner-case parameter as described above with reference to FIGS. 4A and 4B.

While the programming device 404 is described as translating and sending target values to one IC 502, it is anticipated that the programming device 404 may repeat the operations of method 700 for one or more ICs (e.g., ICs 306, 308, 318) operating on the same physical system (e.g., test system 302) that is currently undergoing thermal/power testing as discussed above with reference to FIG. 4A.

Figure 8:
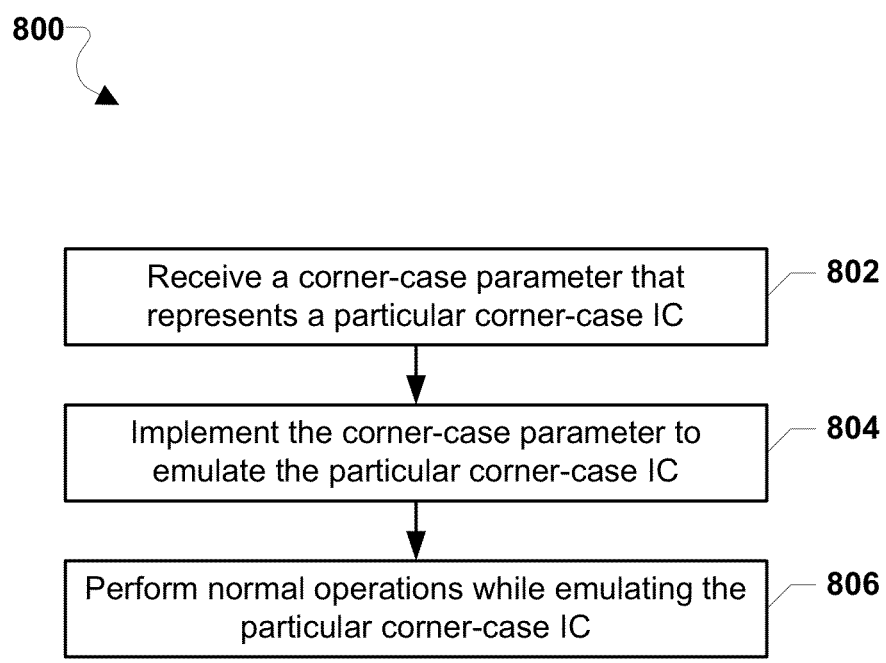
FIG. 8 is a process flow diagram illustrating an overview aspect method for implementing a corner-case parameter on an IC to emulate a corner-case IC.

FIG. 8 illustrates an overview aspect method 800 of emulating a corner-case IC on an IC 502 during power/thermal testing of a test system on which the IC is installed.

In block 802, the IC 502 may receive a corner-case parameter that represents a particular corner-case IC. In an aspect, the IC 502 may receive the corner-case parameter from a programming device 404, for example, after the programming device translates and sends a target leakage value and a target voltage value in block 710 of method 700 described above with reference to FIG. 7.

In block 804, the IC 502 may implement the corner-case parameter to emulate the particular corner-case IC. In an aspect, the IC 502 may use the target voltage value and the target leakage value included in the corner-case parameter to change the leakage and voltage characteristics of the IC 502, thereby emulating the corner-case IC represented in the corner-case parameter. Implementing corner-case parameters is described in further detail below with reference to FIGS. 9-11.

In block 806, the IC 502 may perform normal operations while emulating the particular corner-case IC. In other words, the IC 502 may continue conducting normal activities on the test system (e.g., processing instructions when the IC 502 is a CPU) while simultaneously implementing the target leakage value and target voltage value received in a corner-case parameter.

Thus, testing facilities may be able to observe the performance of the test system as a whole while the IC 502 is performing normal activities at different current leakage and voltage values. By leveraging the IC 502's ability to emulate other ICs while performing normal activities, the various aspects enable corner-case testing of a test system without having to install and uninstall a different IC for each corner case to be tested on the test system.

Figure 9:
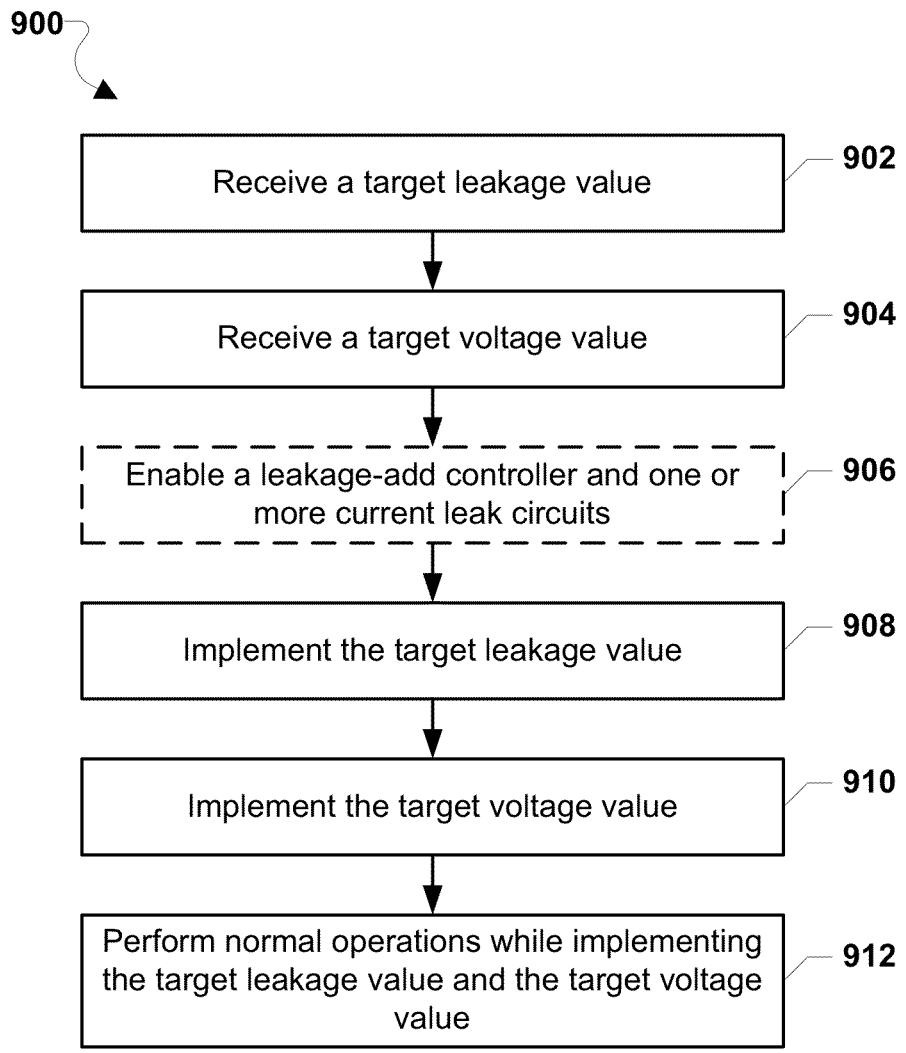
FIG. 9 is a process flow diagram illustrating an aspect method for implementing target leakage and voltage values on an IC.

FIG. 9 illustrates an aspect method 900 that may be implemented by an IC 502 included on a test system for emulating target leakage and voltage values while performing normal activities during corner-case testing of the test system. The operations of method 900 implement an aspect of the operations of method 800 described above with reference to FIG. 8.

In block 902, the IC 502 may receive a target leakage value. The IC 502 may also receive a target voltage value in block 904. In an aspect, a programming device 404 may have sent a corner-case parameter to the IC 502, and the IC 502 may be able to decode the target voltage and leakage values included in the corner-case parameter in order to emulate the target values on the IC 502.

In an optional aspect, the IC 502 may enable a leakage-add controller 506 and one or more current leak circuits 507 in optional block 906. In such an aspect, the IC 502 may be capable of selectively activating the leakage-add controller 506 and the one or more current leak circuits 507 during testing of the test system on which the IC 502 is installed. After testing of the test system has ended, the IC 502 may deactivate the leakage-add controller 506 and the one or more current leak circuits 507. In another aspect (not shown), only preproduction IC may include a leakage-add controller and one or more current leak circuits. In this event, the leakage-add controller 506 and the one or more current leak circuits 507 included on the IC 502 may always be activated because the IC 502 is only used for testing purposes.

In block 908, the IC 502 may implement the target leakage value. In an aspect, the IC 502 may cause the leakage-add controller 506 to implement the target leakage value by calculating the additional amount of current leakage needed to raise the IC 502's natural/actual leakage value to equal the target leakage value. The process of emulating the target leakage value in further described below with reference to FIG. 10.

In block 910, the IC 502 may implement the target voltage value. In an aspect, the IC 502 may configure a programmable voltage table 418—such as the one discussed with reference to FIG. 4—to adjust the amount of voltage applied on the IC 502 to match the target voltage value. The programmable voltage table may accomplish this task through known methods.

In block 912, the IC 502 may perform normal operations while implementing the target leakage value and the target voltage value. In other words, the IC 502 may continue performing operations typical of a similar IC while its actual leakage value is equal to the target leakage value and while its operational voltage is equal to the target voltage.

As discussed above, in further aspects, the IC 502 may implement target leakage and voltage values for one or more corner-case parameters while performing normal activities. As such, the IC 502 may enable testing entities to collect thermal/power testing data for the test system while the IC performs actual operations while exhibiting corner cases characteristics. Because the IC 502 may adjust its current leakage and voltage characteristics, the testing entities may observe the performance/quality of the test system when the IC 502 is emulating different corner cases without having to install a different IC on the test system for each corner case.

Figure 10:
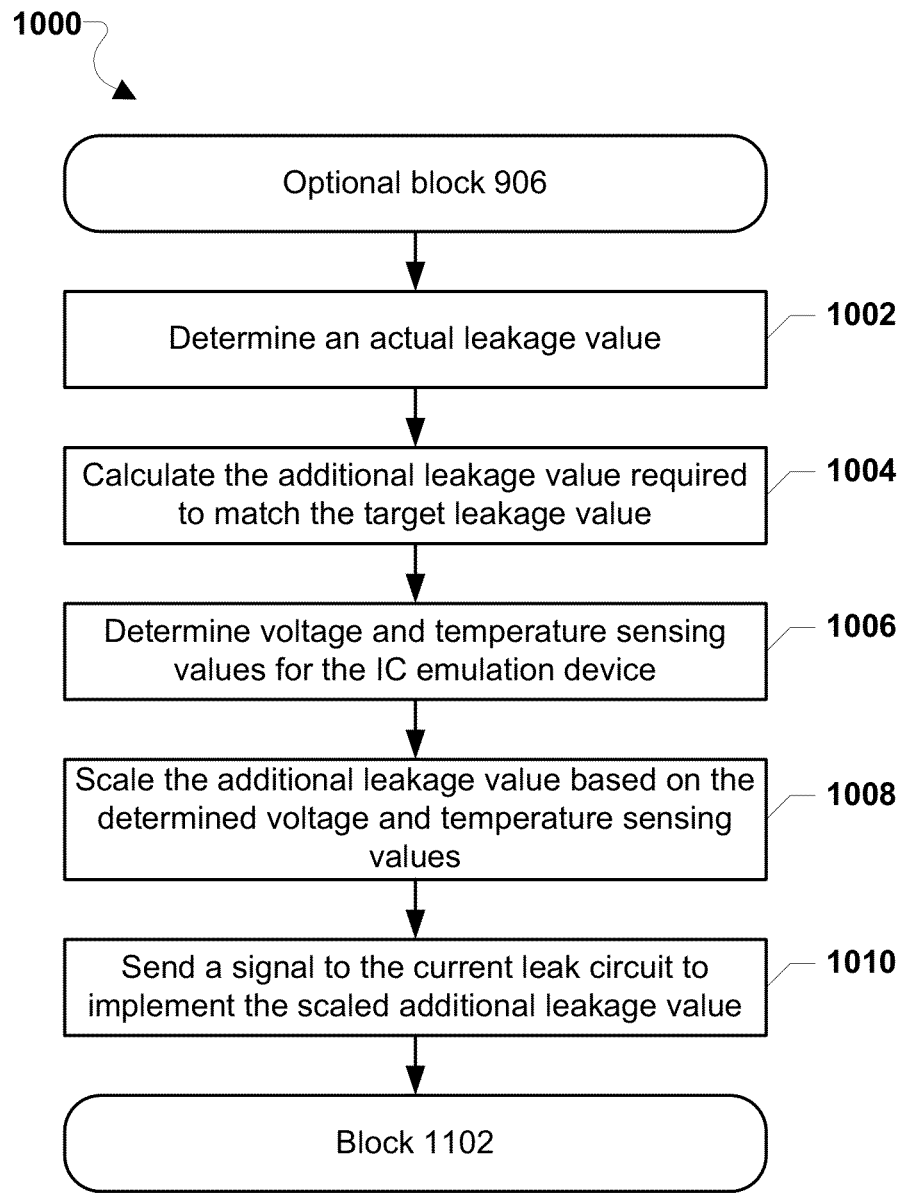
FIG. 10 is a process flow diagram illustrating an aspect method for configuring a current leak circuit to emulate a target leakage value.

FIG. 10 illustrates an aspect method 1000 implemented by an IC 502 for emulating a target leakage value. The operations of method 1000 implement an aspect of the operations of block 908 of method 900 described above with reference to FIG. 9. Thus, in an aspect, the IC 502 may begin performing the operations of method 1000 after optionally enabling the leakage-add controller 506 in optional block 906 or after receiving the target leakage and voltage values in blocks 902 and 904.

In block 1002, the IC 502 may determine an actual leakage value. The actual leakage value may be a measure of the intrinsic current leakage of the IC 502 as described above with reference to FIGS. 5A and 5B. In an aspect, the IC 502 may access the actual leakage value, which may be stored, for example, in a register 508 in memory. In another aspect, the IC 502 may calculate the actual leakage value based on heat and voltage readings received from various sensors 510 operating on the IC 502. In a further aspect, the IC 502 may scale the actual leakage value based on various factors, such as the heat and voltage observed on the IC 502, as well as determined characterizations of the IC 502's silicon composition.

In block 1004, the IC 502 may calculate the additional leakage required to match the target leakage value. In an aspect, the additional leakage required to match the target leakage value may be the difference between the target leakage value and the actual leakage value determined in block 1002.

In block 1006, the IC 502 may determine voltage and temperature sensing values for the IC 502. In an aspect, the IC 502 may measure these values or receive them from another component on the IC 502, such as voltage and/or temperature sensors 510 in the hardware core of the IC 502.

In block 1008, the IC 502 may scale the additional leakage value based on the determined voltage and temperature sensing values. In an aspect, the IC 502 may scale the calculated difference to account for voltage and temperature variations on the IC 502. In other words, the IC 502 may scale the additional leakage value to account for the effects of the additional heat and voltage resulting from increasing the IC 502's actual leakage value to match the target leakage value. In a further aspect, in scaling the additional leakage value, the IC 502 may utilize the formula 530 or a variation of the formula 530 described above with reference to FIG. 5B.

In block 1010, the IC 502 may send a signal to a current leak circuit 507 to emulate the scaled additional leakage value. In an aspect, the IC 502 may signal more than one current leak circuit to emulate the scaled additional leakage value. In a further aspect, the one or more current leak circuits may be positioned at various locations on the IC 502 to better emulate the actual thermal/electrical characteristics of an IC with a leakage value equal to the target leakage value. In an another aspect, the IC 502 may configure the one or more current leak circuits such that the combined efforts of the one or more current leak circuits causes the IC 502's actual leakage value to match the target leakage value.

This process may continue in block 1102 in method 1100 described below with reference to FIG. 11.

In an aspect, the operations of method 1000 may be performed by a leakage-add controller included on the IC 502 (e.g., leakage-add controller 506 described above with reference to FIG. 5A). In another aspect, the operations of method 1000 may be performed by a processing unit included on the IC 502 (not shown). In another aspect, a leakage-add controller and a separate processing unit may function together to perform the operations of method 1000. In yet another aspect, a leakage-add controller may be a set of software instructions for implementing a target leakage value on one or more current leak circuits and may be executed on a processing unit included on the IC 502.

Figure 11:
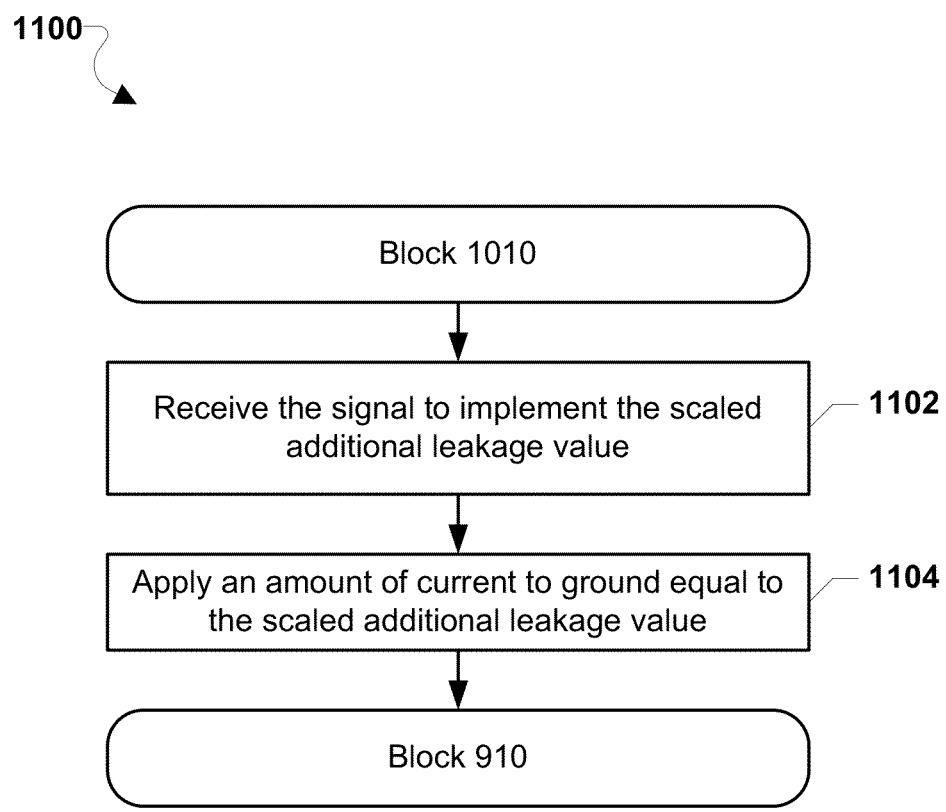
FIG. 11 is a process flow diagram illustrating an aspect method for applying an additional amount of leakage with a current leak circuit on an IC to match a target leakage value.

FIG. 11 illustrates an aspect method 1100 that may be implemented by a current leak circuit 507 operating on the IC 502 for adjusting the IC 502's actual leakage value to match a target leakage value. In an aspect, the current leak circuit 507 may begin performing method 1100 after being signaled in block 1010 of method 1000 described with reference to FIG. 10.

In block 1102, the current leak circuit 507 may receive the signal to implement the scaled additional leakage value. In an aspect, the leakage-add controller 506 and/or a processing unit on the IC 502 may have computed the scaled additional leakage value in block 1008 of method 1000 described above with reference to FIG. 10. In another aspect, the signal may be a leakage current control signal instructing the current leak circuit 507 to draw a certain number of microamps of current such that drawing the designated current will cause the IC 502's actual leakage to equal the target leakage value.

In block 1104, the current leak circuit 507 may apply an amount of current to ground equal to the scaled additional leakage value. In an aspect, the current leak circuit 507 may drive the signaled number of microamps of current to ground, thereby causing the current leak circuit 507 to drain current equal to the scaled additional leakage value. Thus, in an aspect, the current leak circuit 507 may enable the IC 502 have the same leakage characteristics as a corner-case IC associated with the target leakage value.

The process may continue as the IC 502 may continue performing by implementing the target voltage value in block 910 of method 900 described with reference to FIG. 9.

In addition to using the IC's dynamic ability to adjust its power characteristics to test corner cases on test systems, ICs may also use the aspect circuitry to adjust their power characteristics during normal operation to achieve other beneficial effects on devices/products produced for customers (i.e., "production systems") as described below.

ICs in a production batch (i.e., a batch of ICs not used for testing) may be fully functioning and include a leakage-add controller, programmable voltage table, and one or more current leak circuits as described above. ICs installed on production systems may be stand alone ICs or part of an SOC implemented in product devices. As discussed above, ICs in any production batch naturally exhibit differences in their current leakage and processing speed that result in the corner-cases. As a result, ICs installed in production devices will result in a range of power performances depending upon the spread of the performance distribution exhibited among the ICs in the production batch. This variability may cause problems for device manufacturers because their devices must be designed to accommodate any IC in a production batch. While a slightly larger battery or a more capable thermal management/heat transfer design can accommodate lower performance ICs, such designs may be not be well suited for the highest performance ICs. Thus, the thermal/performance variability within a batch of production ICs can be an issue for device manufacturers who want production systems to have relatively consistent performance. In other words, device manufacturers may desire less variability within a batch of production ICs to make sure customers receive devices that perform roughly equally.

In further aspects, ICs installed in a group of production systems may be configured to use the aspect leakage-add controller, programmable voltage table, and one or more current leak circuits described above to adjust their thermal and operating frequency performance to reduce the variability among production ICs. Specifically, the ICs may be configured to operate normally at pre-determined target leakage and voltage values when their measured current leakage, thermal performance and/or processing speed are significantly better than the batch average. Thus, by using the aspect current leak circuits, ICs with abnormally better current/thermal performance can be adjusted so they are closer to the average. By activating the current leak circuits in this way, the IC manufacturer can reduce the IC-to-IC power variability in the production batch to enable device manufacturers to make products that exhibit a more-uniform power performance and behavior. This activation of the aspect current leak circuits may be accomplished by measuring the current leakage and processing performance of each IC in a test apparatus during production, determining a current leakage that is appropriate for each IC based on a difference between that IC's performance and the mean or a target performance value, and storing values in the programmable voltage table on the IC so that the leakage-add controller can activate the current leak circuits to achieve or come closer to the targeted performance. Then in operation, the aspect current leak circuits function as described above so that the IC will exhibit performance closer to the average for the production batch or to a target performance advertised by the IC manufacturer.

Similarly, in another aspect, production ICs that will be installed in a group of production systems may be configured to adjust their voltage requirement and leakage values in order to reduce the natural system-to-system power variation resulting from the natural power variations in peripheral devices also installed in the group of production systems and coupled to the ICs. In other words, because similar peripheral devices installed on production systems may naturally require different amounts of power, the production systems may experience different power performances, such as higher or lower battery drain or operating temperatures. For example, an IC may be installed on a device (or SOC included in a device) and may be coupled to a peripheral device (e.g., a display screen) that requires less power to operate than similar peripheral devices. Thus, the programming device may configure the ICs installed in the group of production systems to activate their current leak circuits to "adapt" to the power requirements of peripheral devices (i.e., implement certain target leakage and voltage values) to decrease the overall variability of production systems that include the ICs and peripheral devices.

Figure 12A:
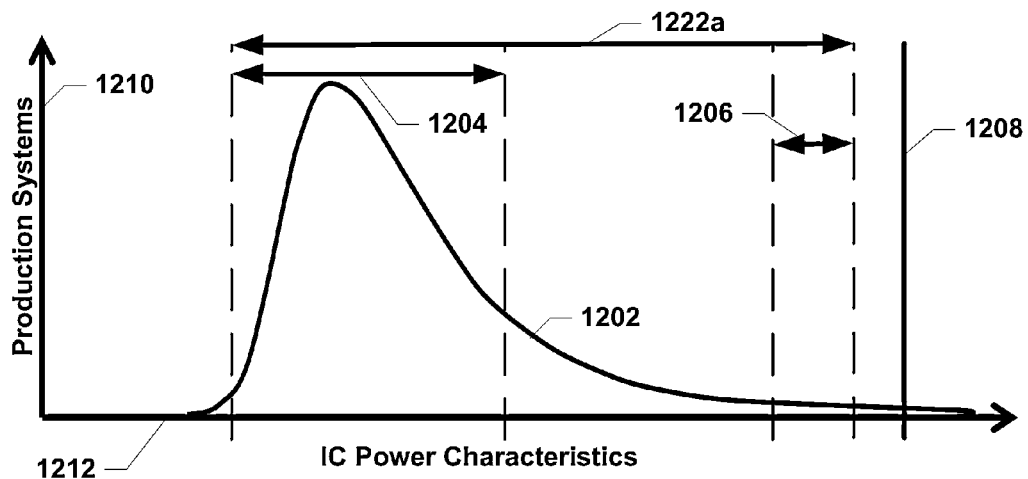
FIG. 12A is a graph illustrating a natural distribution of production systems in a group of production systems based on their ICs' power characteristics.
Figure 12B:
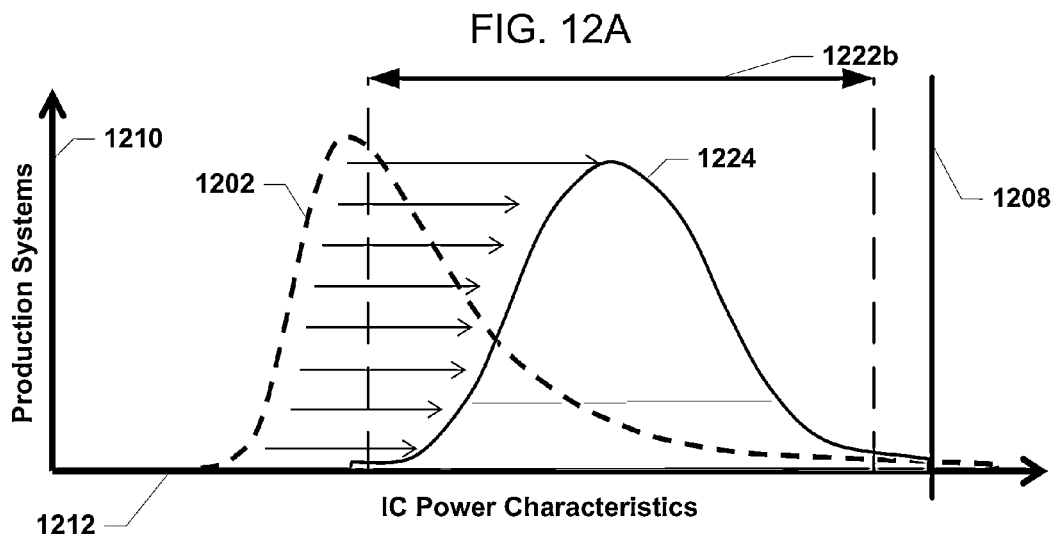
FIG. 12B is a graph illustrating a preferred distribution of production systems in a group of production systems after adjusting their ICs' power characteristics.

FIGS. 12A and 12B illustrate graphs of representative distributions of ICs' power characteristics. The graphs graphically represent the number of production systems 1210 (i.e., the y-axis) in a group of production systems that include an IC with a particular power characteristic in a range of IC power characteristics 1212 (i.e., the x-axis). The range of IC power characteristics 1212 may represent the current leakage values and/or voltage requirement values for ICs included in the group of production systems. Alternatively, the graphs may represent a particular power characteristics value that represents the worst acceptable power performance of the ICs (i.e., the screening upper limit 1208). Production systems that include ICs with power characteristics that exceed the screening upper limit 1208 may be "defective" because they are inconsistent with the power characteristics of production systems.

FIG. 12A illustrates an example distribution 1202 of power characteristics among production systems due to production variability in ICs' power characteristics. As discussed above with reference to FIGS. 1A and 1B, each IC's natural current leakage and voltage requirements may vary. Because production systems' power performance depends in part on the power characteristics of the installed ICs, the power performance distribution of production systems may have the shape of the distribution curve 1202 in FIG. 12A. The distribution curve 1202 represents the number of production systems 1210 (on the vertical axis) that have installed ICs exhibiting particular current leakage and/or voltage characteristics ("IC Power Characteristics" on the horizontal axis) within the range of IC power characteristics 1212. As illustrated in FIG. 12A, the IC Power Characteristics distribution curve 1202 may be skewed such that while there are many ICs with superior performance (e.g., low current leakage) within range 1204, there are also a number of IC's in the production batch with significantly worse performance within range 1206. As a result, the width 1222a of the IC power characteristics may be larger than desirable for achieving consistent performance of production systems.

In an aspect, by operating the current leak circuits on ICs with naturally superior current leakage performance, the distribution of IC power characteristics in production systems can be shifted to remove the skew, and thus narrow the distribution (i.e., reduce the width 1222b) as illustrated in FIG. 12B. As illustrated, by setting appropriate values in the programmable voltage table in each IC, better performing ICs may have their power characteristics degraded while ICs exhibiting worse power characteristics may not be adjusted. The result may be a more normal distribution 1224, such as a near Gaussian distribution that has a narrower width 1222b or range of power characteristics compared to the natural distribution 1202 of the production run. In other words, by increasing the current leakage and voltage requirements for certain ICs in a batch, the overall performance of the group of production systems may be more consistent and predictable because, after adjustment, the distribution of IC power performance is narrower.

Figure 12C:
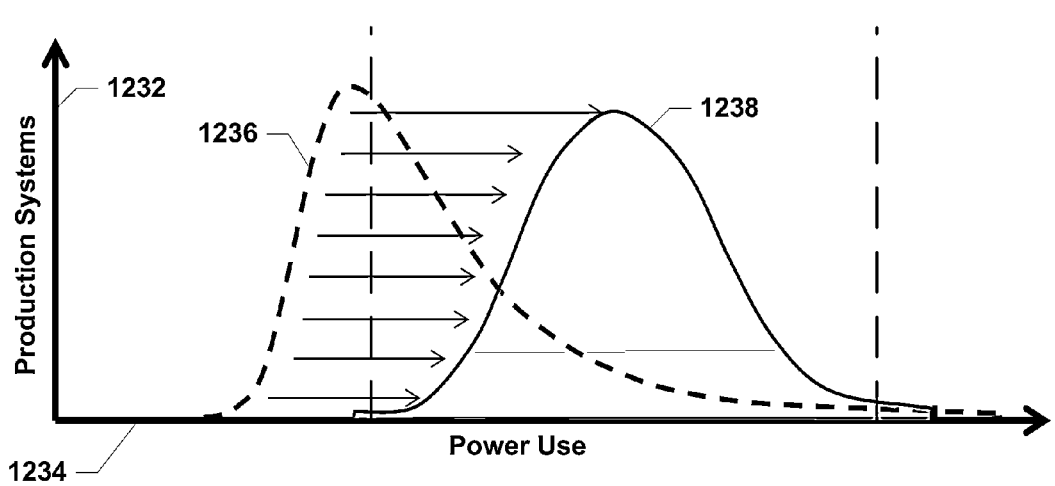
FIG. 12C is a graph illustrating a preferred distribution of production systems in a group of production systems after adjusting their ICs' power characteristics to account for difference in power use of peripheral devices installed on the production systems.

A narrower distribution of IC power performance achieved by implementing this aspect can result in a more uniform distribution 1238 of power use by production systems as illustrated in FIG. 12C. Thus, as illustrated in FIG. 12C, the number of production systems in the group 1232 that have a power use within a range of power use values 1234 may fall within a natural distribution curve 1236.

Figure 13:
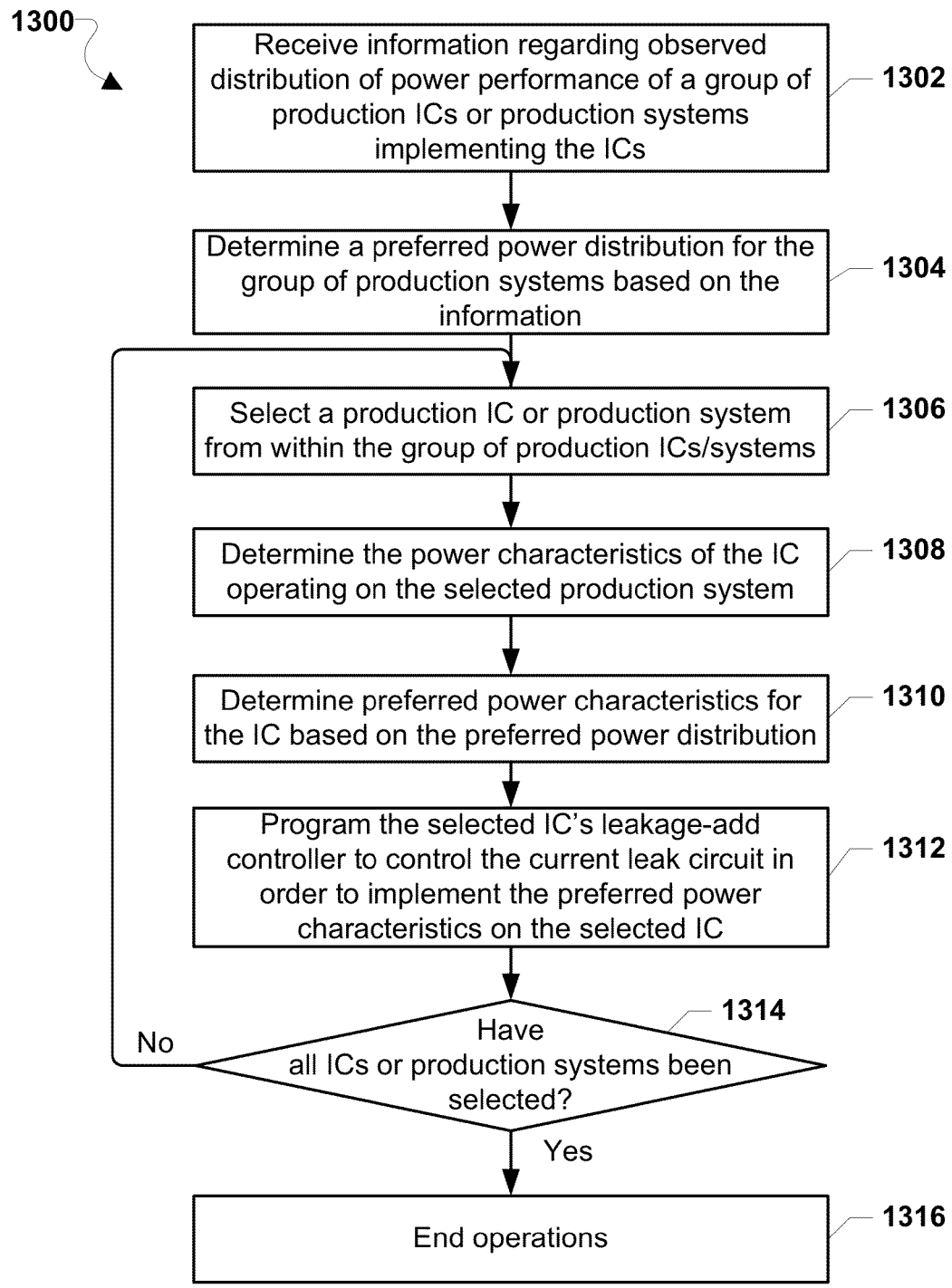
FIG. 13 is a process flow diagram illustrating an aspect method for configuring ICs operating on production systems to implement power characteristics to create more uniform power performances in a group of production systems.

FIG. 13 illustrates an aspect method 1300 that may be implemented by a programming device to configure an IC operating on a production system to implement preferred power characteristics using the aspect leakage-add controller, programmable voltage table, and one or more current leak circuits. Such ICs are fully functional (i.e., capable of performing typical IC operations) and include an aspect leakage-add controller, programmable voltage table, and one or more current leak circuits as described above with reference to FIG. 3. The operations in method 1300 may be performed on ICs during or after their production, such as by an IC manufacturer using a test and programming machine, or on production devices in which the ICs have already been installed using a programming device similar to the test programming devices described above.

In block 1302, the programming device may receive information regarding an observed distribution of power performance of a production lot of ICs or a group of production systems implementing the ICs. Such information regarding a group of production ICs may be obtained during production in a quality or testing process and maintained on a production line server. In an aspect, the information may include details about the power characteristics (i.e., current leakage and/or voltage requirements) of ICs installed in a group of productions systems. In another aspect, the information may include the power performance of peripheral devices included in the production systems. For example, the information may indicate the power requirements for display screens included on the production systems.

In block 1304, the programming device may determine a preferred distribution for the group of production systems based on the obtained information. In an aspect, as discussed with reference to FIGS. 12A-12C, the programming device may determine the distribution of the IC power characteristics and characterize the distribution (e.g., to identify skew and distribution width) of the production ICs or the group of production systems that may reflect the different power characteristics in the production systems' ICs. Based on the observed distribution curve, the programming device may calculate or determine a preferred distribution shape to achieve more uniform power performances in production systems.

In an aspect, the programming device (either a test and programming machine in an IC manufacturer or an IC programming device that can program IC programmable voltage tables when the ICs are installed in devices) may determine the power characteristics of the ICs in the production systems and the extent to which each IC should adjust its power characteristics (i.e., current leakage and/or voltage requirement) in order for the entire group of production systems to exhibit a more uniform power performance. In other words, the programming device may determine how much each IC should increase its current leakage using its leakage-add controller and current circuits and/or how much additional voltage must be applied to the IC by the programmable voltage table.

In block 1306, the programming device may select an IC or production system from within the group of production ICs/systems. In an aspect, the programming device may use various known methods of selecting a production IC/system. In block 1308, the programming device, or a computing system coupled to the programming device, may determine the power characteristics of an IC operating on the selected production system. For example, the programming device may determine that the selected IC exhibits a certain natural current leakage and certain natural voltage requirement to achieve a given processing speed.

In block 1310, the programming device may determine preferred power characteristics for the selected IC based on the preferred power distribution. In an aspect, the programming device may determine that the IC should increase its current leakage by a certain amount in order to conform to the preferred power distribution curve.

The programming device may also program the selected IC's leakage-add controller to control the current leak circuit in order to implement the preferred power characteristics on the selected IC in block 1312. In an aspect, the programming device may accomplish this by programming the selected IC to implement the adjusted power characteristics by storing the corresponding values in its programmable voltage table. In a further aspect, the programming device may send a signal including the adjusted power characteristics as described above with reference to FIGS. 4A and 4B. In another aspect, the programmable voltage table may be programmed to include a preferred leakage value and/or a preferred voltage value, information that the leakage-add controller can use to operate aspect current leak circuits to achieve the desired power performance in view of the IC's base power performance characteristics. Thus, the selected IC may be programmed to implement the adjusted power characteristics in a manner similar to the method described above for implementing corner-case parameters. In an aspect, the leakage-add controller (or another processing unit) may determine how much additional current to add based on a target leakage value included in the preferred characteristics and may control one or more current leak circuits to add the additional current. In another aspect, a programmable voltage table included on the selected IC may implement an adjusted voltage value to match a target voltage value included in the preferred power characteristics by applying the adjusted voltage value on the IC.

In determination block 1314, the programming device may determine whether all production ICs/systems have been selected. In an aspect, the programming device may program one or more ICs for each production system in a group of production systems in order to implement a preferred distribution curve as described above with reference to FIGS. 12B and 12C. When the programming device determines that all production ICs/systems have not been selected (i.e., determination block 1314="No"), the process may continue until each production IC/system's power performance has been programmed to the preferred distribution curve.

When the programming device determines that all production ICs/systems have been selected (i.e., determination block 1314="Yes"), the programming device may end operations in block 1316.

Figure 14:
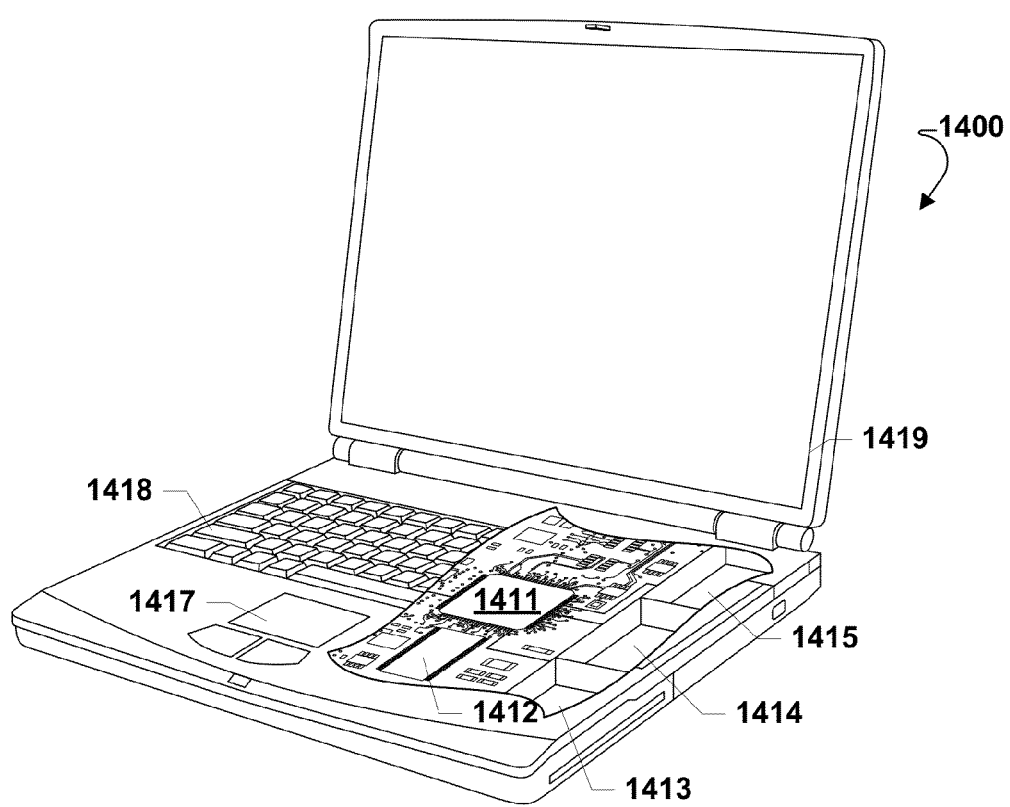
FIG. 14 is a block diagram of an example programming device according to an aspect.

The aspects described above regarding the programming device may be implemented within a variety of computing devices, such as a laptop computer 1400 illustrated in FIG. 14. Many laptop computers include a touchpad touch surface 1417 that serves as the computer's pointing device, and thus may receive drag, scroll, and flick gestures similar to those implemented on mobile computing devices equipped with a touch screen display. A laptop computer 1400 will typically include a processor 1411 coupled to volatile memory 1412 and a large capacity nonvolatile memory, such as a disk drive 1413 of Flash memory. The computer 1400 may also include a floppy disc drive 1414 and a compact disc (CD) drive 1415 coupled to the processor 1411. In a notebook configuration, the computer housing includes the touchpad 1417, the keyboard 1418, and the display 1419 all coupled to the processor 1411. Other configurations of the programming device may include a computer mouse or trackball coupled to the processor (e.g., via a USB input) as are well known, which may also be use in conjunction with the various aspects.

The foregoing method descriptions and the process flow diagrams are provided merely as illustrative examples and are not intended to require or imply that the steps of the various aspects must be performed in the order presented. As will be appreciated by one of skill in the art the order of steps in the foregoing aspects may be performed in any order. Words such as "thereafter," "then," "next," etc. are not intended to limit the order of the steps; these words are simply used to guide the reader through the description of the methods. Further, any reference to claim elements in the singular, for example, using the articles "a," "an," or "the" is not to be construed as limiting the element to the singular.

As used in this application, the terms "component," "controller," "system," "engine," "generator," "manager," and the like are intended to include a computer-related entity, such as, but not limited to, hardware, firmware, a combination of hardware and software, software, or software in execution, which are configured to perform particular operations or functions. For example, a component may be, but is not limited to, a process running on a processor, a processor, an object, an executable, a thread of execution, a program, and/or a computer. By way of illustration, both an application running on a programming device and the programming device may be referred to as a component. One or more components may reside within a process and/or thread of execution and a component may be localized on one processor or core and/or distributed between two or more processors or cores. In addition, these components may execute from various non-transitory computer readable media having various instructions and/or data structures stored thereon. Components may communicate by way of local and/or remote processes, function or procedure calls, electronic signals, data packets, memory read/writes, and other known network, computer, processor, and/or process related communication methodologies.

The various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The hardware used to implement the various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic circuit, discrete gate or transistor logic, discrete hardware components, or any combination thereof designed to perform the functions described herein. A general-purpose processor may be a multiprocessor, but, in the alternative, the processor may be any conventional processor, controller, microcontroller, or state machine. A processor may also be implemented as a combination of computing devices, e.g., a combination of a DSP and a multiprocessor, a plurality of multiprocessors, one or more multiprocessors in conjunction with a DSP core, or any other such configuration. Alternatively, some steps or methods may be performed by circuitry that is specific to a given function.

In one or more exemplary aspects, the functions described may be implemented in hardware, software, firmware, or any combination thereof. If implemented in software, the functions may be stored as one or more instructions or code on a non-transitory computer-readable medium or non-transitory processor-readable medium. The steps of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed aspects is provided to enable any person skilled in the art to make or use the present invention. Various modifications to these aspects will be readily apparent to those skilled in the art, and the generic principles defined herein may be applied to other aspects without departing from the spirit or scope of the invention. Thus, the present invention is not intended to be limited to the aspects shown herein but is to be accorded the widest scope consistent with the following claims and the principles and novel features disclosed herein.

What is claimed is:

1. An integrated circuit, comprising:
    a current leak circuit comprising a resistor and a switch configured to couple the resistor to a voltage source; and
    a leakage-add controller coupled to the current leak circuit and configured to instruct the current leak circuit to control the switch in order to emulate a target leakage value on the integrated circuit that is greater than an actual leakage current of the integrated circuit by drawing an additional amount of current leakage from the voltage source through the resistor to match the target leakage value.

2. The integrated circuit of claim 1, wherein the integrated circuit is further configured to perform operations of a typical integrated circuit.

3. The integrated circuit of claim 1, further comprising a processing unit separate from the leakage-add controller and configured to calculate the additional amount of current leakage.

4. The integrated circuit of claim 1, wherein the leakage-add controller is further configured to calculate the additional amount of current leakage.

5. The integrated circuit of claim 4, further comprising:
    sensors coupled to the leakage-add controller and configured to measure voltage and temperature values of the integrated circuit,
    wherein the leakage-add controller is configured to scale the additional amount of current leakage based on the voltage and temperature values.

6. The integrated circuit of claim 1, further comprising:
    a programmable voltage table configured to apply a target voltage value on the integrated circuit.

7. The integrated circuit of claim 6, wherein the target voltage value and the target leakage value are received from a programming device.

8. The integrated circuit of claim 6, wherein the target voltage value and the target leakage value are derived from a preferred distribution curve of a group of production systems during normal operations.

9. A method of emulating corner-case integrated circuits in addition to performing normal activities in an integrated circuit comprising a leakage-add controller and a current leak circuit, the current leak circuit comprising a resistor and a switch configured to couple the resistor to a voltage source, the method comprising:
    receiving, by the leakage-add controller, a corner-case parameter comprising a target leakage value that represents a particular corner-case integrated circuit, wherein the target leakage value is greater than an actual leakage value of the integrated circuit; and
    implementing the target leakage value on the integrated circuit to emulate the particular corner-case integrated circuit by the leakage-add controller instructing the current leak circuit to control the switch to draw an additional amount of current leakage from the voltage source through the resistor to match the target leakage value.

10. The method of claim 9, wherein receiving a corner-case parameter comprises:
receiving a target leakage value; and
receiving a target voltage value.

11. The method of claim 10, further comprising enabling the leakage-add controller and the current leak circuit in response to receiving the target leakage value.

12. The method of claim 10, wherein implementing the corner-case parameter comprises:
implementing the target leakage value; and
implementing the target voltage value.

13. The method of claim 12, wherein the integrated circuit further comprises a programmable voltage table and wherein implementing the target voltage value comprises implementing the target voltage value with the programmable voltage table.

14. The method of claim 12, wherein implementing the target leakage value comprises:
determining an actual leakage value;
calculating an additional leakage value required to match the target leakage value, wherein the additional leakage value is equal to a difference between the target leakage value and the actual leakage value;
determining voltage and temperature sensing values for the integrated circuit;
scaling the additional leakage value based on the determined voltage and temperature sensing values; and
sending a signal to the current leak circuit to implement the scaled additional leakage value.

15. The method of claim 14, wherein implementing the target leakage value comprises implementing the target leakage value with at least one of the leakage-add controller and a processing unit.

16. The method of claim 14, further comprising applying with the current leak circuit an amount of current to ground equal to the scaled additional leakage value to ground.

17. An integrated circuit, comprising:
means for receiving a corner-case parameter comprising a target leakage value that represents a particular corner-case integrated circuit, wherein the target leakage value is greater than an actual leakage value of the integrated circuit; and
means for implementing the target leakage value on the integrated circuit to emulate the particular corner-case integrated circuit that draws an additional amount of current leakage from a voltage source through a resistor of a current leakage circuit to match the target leakage value.

18. The integrated circuit of claim 17, wherein means for receiving a corner-case parameter comprises:
means for receiving a target leakage value; and
means for receiving a target voltage value.

19. The integrated circuit of claim 18, further comprising means for enabling the means for implementing the corner-case parameter in response to receiving the target leakage value.

20. The integrated circuit of claim 18, wherein means for implementing the corner-case parameter comprises:
means for implementing the target leakage value; and
means for implementing the target voltage value.

21. The integrated circuit of claim 20, wherein means for implementing the target leakage value comprises:
means for determining an actual leakage value;
means for calculating an additional leakage value required to match the target leakage value, wherein the additional leakage value is equal to a difference between the target leakage value and the actual leakage value;
means for determining voltage and temperature sensing values for the integrated circuit;
means for scaling the additional leakage value based on the determined voltage and temperature sensing values; and
means for implementing the scaled additional leakage value.

22. The integrated circuit of claim 21, wherein means for implementing the scaled additional leakage value comprises means for applying an amount of current to ground equal to the scaled additional leakage value to ground.

* * * * *